United States Patent [19]
Douseki

[11] Patent Number: 5,821,769
[45] Date of Patent: Oct. 13, 1998

[54] LOW VOLTAGE CMOS LOGIC CIRCUIT WITH THRESHOLD VOLTAGE CONTROL

[75] Inventor: Takakuni Douseki, Atsugi, Japan

[73] Assignee: Nippon Telegraph and Telephone Corporation, Tokyo, Japan

[21] Appl. No.: 634,552

[22] Filed: Apr. 18, 1996

[30] Foreign Application Priority Data

Apr. 21, 1995 [JP] Japan .................................. 7-120902
Aug. 18, 1995 [JP] Japan .................................. 7-232112

[51] Int. Cl.$^6$ .............................................. H03K 19/0944
[52] U.S. Cl. ............................... 326/34; 326/17; 326/83; 326/121; 327/534
[58] Field of Search ................................. 326/31, 33–34, 326/112, 119, 121, 81, 17, 15, 27, 83, 86; 327/534, 537, 333

[56] References Cited

U.S. PATENT DOCUMENTS

| | | | |
|---|---|---|---|
| 3,914,702 | 10/1975 | Gehweiler | 326/121 |
| 4,647,798 | 3/1987 | Crafts et al. | 326/31 |
| 4,906,587 | 3/1990 | Blake | 437/41 |
| 4,964,082 | 10/1990 | Sato et al. | 327/534 |
| 5,160,855 | 11/1992 | Dobberpuhl | 327/333 |
| 5,373,199 | 12/1994 | Shichinohe et al. | 326/83 |
| 5,382,844 | 1/1995 | Knauer | 326/121 |
| 5,387,824 | 2/1995 | Michelsen | 326/87 |
| 5,479,107 | 12/1995 | Knauer | 326/121 |
| 5,574,389 | 11/1996 | Chu | 326/81 |

FOREIGN PATENT DOCUMENTS

| | | |
|---|---|---|
| 6-282306 | 1/1966 | Japan . |
| A-62 264670 | 5/1988 | Japan . |
| 7-182869 A | 12/1993 | Japan . |
| A-6-029834 | 5/1994 | Japan . |
| 6-237164 | 8/1994 | Japan . |
| 7-182869 | 7/1995 | Japan . |
| 8-17183 | 1/1996 | Japan . |

OTHER PUBLICATIONS

Sixth Annual IEEE International ASIC Conference & Exhibit, Proceedings, 1993, pp. 186–189, Mutoh et al, "1V High–Speed Digital Circuit Technology with 0.5 $\mu$m Multi–Threshold CMO's".

1989 IEEE SOS/SOI Technology Conference, Oct. 3, 1989, Nevada USA, pp. 128–129, XP 000167665 Matloubian et al, "Smart Body Contact for SOI MOSFETs".

IEEE, International Electron Device Meeting, 1994 San Francisco, California, USA, pp. 79–82, T. Andoh et al, "Design Methodology for Low–Voltage MOSFETs".

"Selection of Operation Mode on SOI/MOSFET's for High–Resistivity Load Static Memory Cell", Y. Yamaguchi et al, IEEE 1993, pp. 94–95.

"Switched–Source–Impedance CMOS Circuit for Low Standby Sub–Threshold Current Giga–Scale LSI's", M. Horiguchi, et al, IEEE Journal of Solid–State Circuits. vol. 28, No. 11, Nov. 1993, pp. 1131–1135.

"An SOI–Dram with Wide Operating Voltage Range by CMOS/SIMOX Technology" K. Suma, et al; IEEE 1994, pp. 138–139, 324.

"TP 5.4:A 0.5V SIMOX–MTCMOS Circuit with 200ps Logic Gate", T. Douseki et al, 1996 IEEE International Solid–State Circuits Conference, pp. 84–85, 0–7803–3136–2/1996 IEEE.

(List continued on next page.)

*Primary Examiner*—Jon Santamauro
*Attorney, Agent, or Firm*—Frishauf, Holtz, Goodman, Langer & Chick, P.C.

[57] ABSTRACT

A MOSFET circuit achieving high speed operation and low power consumption for a wide supply voltage range. MOSFET circuits are connected between a low threshold voltage CMOS circuit and a supply voltage and ground, as a power controller for switching power supply in response to sleep/active modes. High threshold voltage MOSFETs in the MOSFET circuits are gate biased by low threshold voltage MOSFETs, thereby preventing a current from flowing across the backgate terminal and the source terminal.

28 Claims, 26 Drawing Sheets

OTHER PUBLICATIONS

"TP 5.4:A 0.5V SIMOX–MTCMOS Circuit with 200ps Logic Gate", T. Douseki et al, 1996 ISSCC Slide Supplement/IEEE, pp. 66–67, 364–365.

"A Dynamic Threshold Voltage MOSFET (DTMOS) for Ultra–Low Voltage Operation", F. Assaderaghi et al., Technical Digest, International Electron Devices Meeting, San Francisco, CA, Dec. 11–14, 1994, pp. 809–813, 0–7803–2111–1/1994 IEEE.

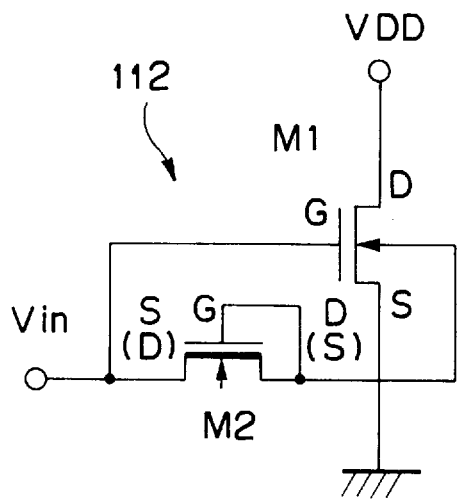
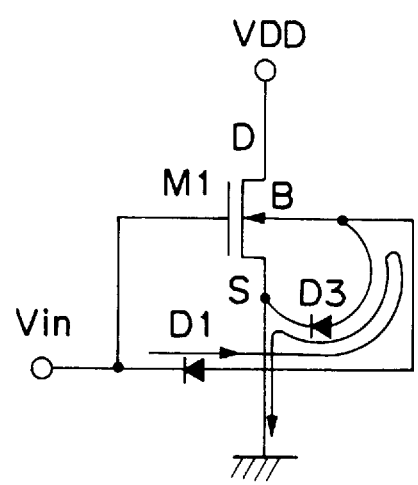
FIG.7A          FIG.7B
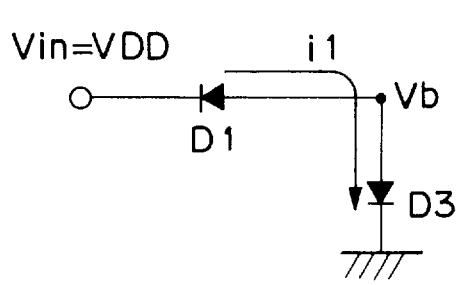
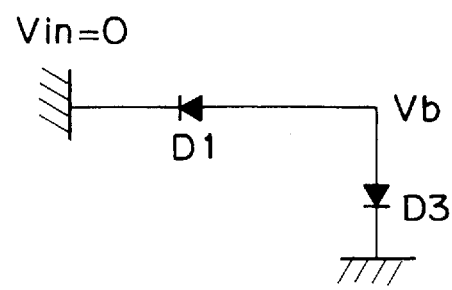
FIG.7C          FIG.7D

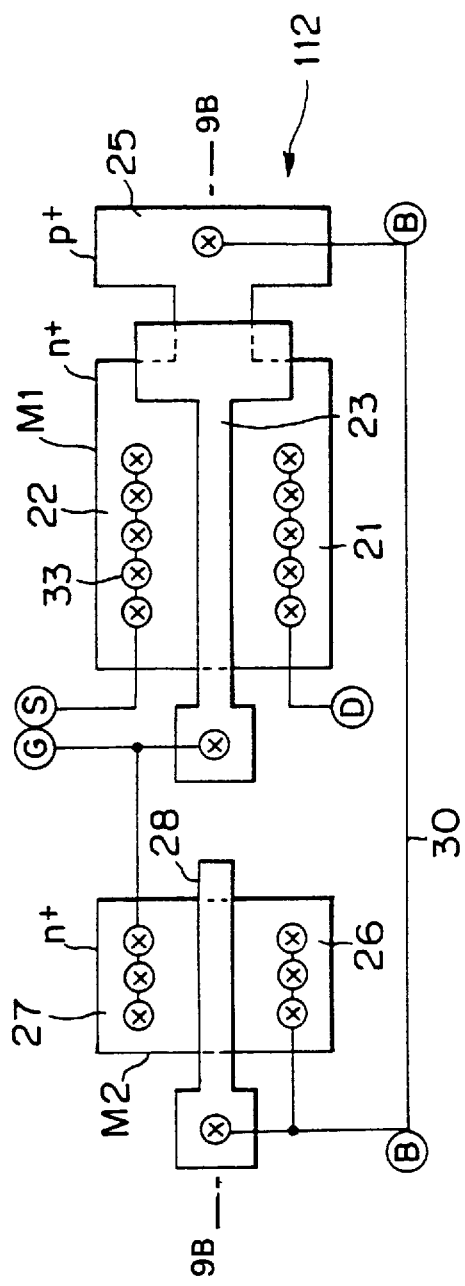
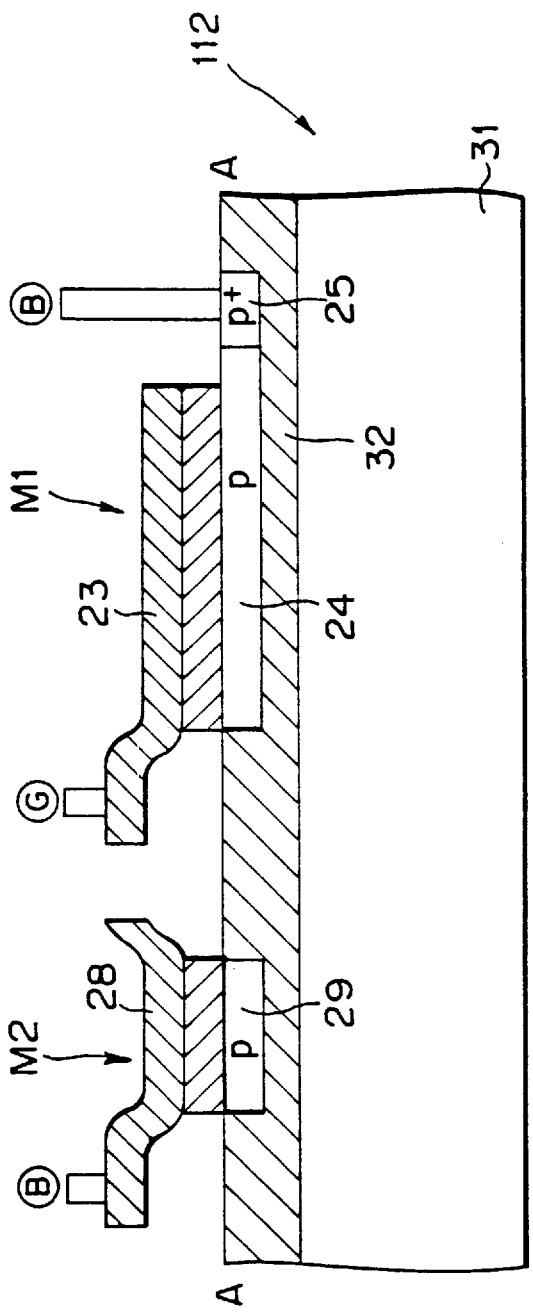
FIG.9A
FIG.9B

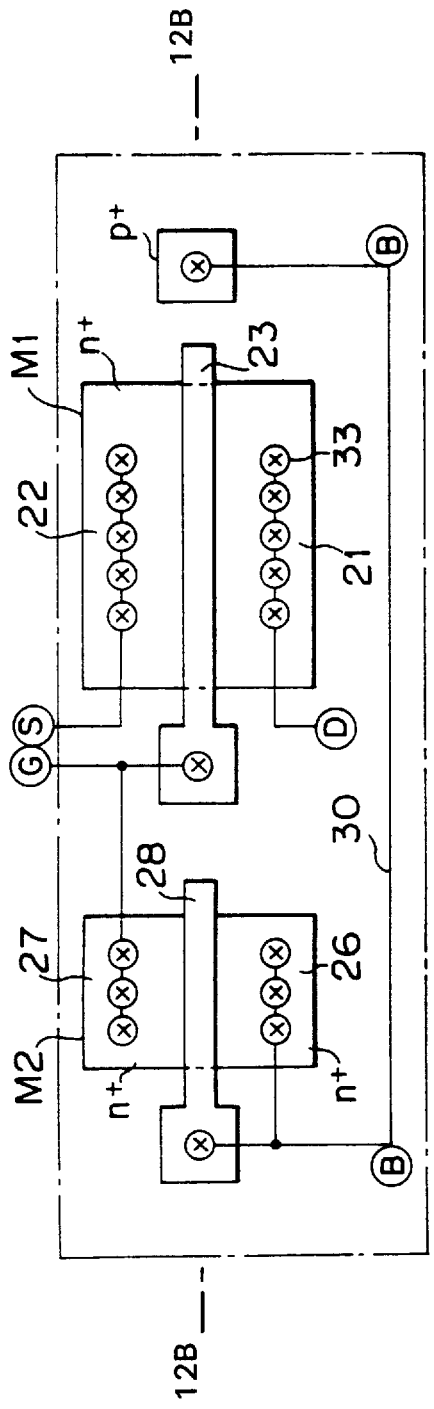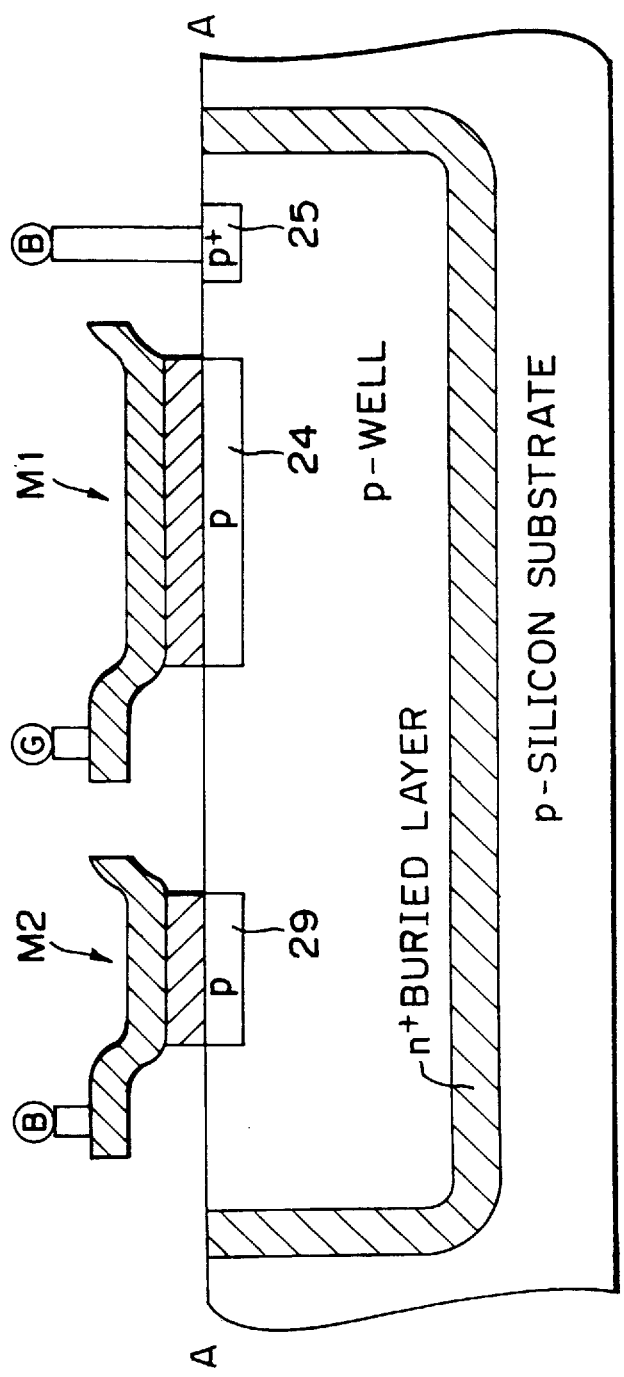
FIG.12A
FIG.12B (PRESENT INVENTION)

(PRESENT INVENTION)

| MODE SIGNAL | ACTIVE | SLEEP |
|---|---|---|
| C | L | H |
| *C | H | L |

LOW VOLTAGE CMOS LOGIC CIRCUIT WITH THRESHOLD VOLTAGE CONTROL

BACKGROUND OF THE INVENTION

1. Field of the Invention

The present invention relates to a MOSFET that can achieve high speed operation and low power consumption in a wide supply voltage range from low to high voltages, and particularly to a MOSFET suitable for an SOI (Silicon On Insulator) integrated circuit, and CMOS logic circuits using this MOSFET.

2. Description of Related Art

A conventional low voltage CMOS logic circuit is disclosed in Japanese patent application laying-open No. 29834/1994. The CMOS logic circuit can operate with 1V battery supply by combining a plurality of MOSFETs of a low threshold voltage (of about 0.2V) and a high threshold voltage (of about 0.6V) as shown in FIG. 1. The circuit is an ingenious combination of low threshold voltage MOSFETs and high threshold voltage MOSFETs, the former being capable of high speed operation at the cost of a large leakage current in the non-conductive state, whereas the latter having small leakage current in the non-conductive state at the cost of a low operating speed.

More specifically, the circuit includes a quasi-high-potential (VDDv) power supply line 41 and a quasi-low-potential (VDDs) power supply line 51 in addition to a high-potential (VDD) power supply line 1 and a low-potential (VSS) power supply line 2 which is normally grounded as shown in FIG. 1. Between these lines 41 and 51, a low threshold voltage CMOS logic circuit 3 is connected which comprises low threshold voltage p-channel MOSFETs M11 and n-channel MOSFETs M12. Furthermore, a p-channel MOSFET M13 is connected between the quasi-high-potential power supply line 41 and the high-potential power supply line 1, and an n-channel MOSFET M14 is connected between the quasi-low-potential power supply line 51 and the low-potential power supply line 2. The reference numeral 4 designates a high-potential power supply controller including MOSFET M13 and the quasi-high-potential power supply line 41, and the reference numeral 5 denotes a low-potential power supply controller including the MOSFET M14 and the quasi-low-potential power supply line 51.

The CMOS logic circuit 3 is arranged with the low threshold voltage MOSFETs M11 and M12, and this enables a high speed operation with a low supply voltage. In addition, since the power supply passage to the low threshold voltage CMOS logic circuit 3 is provided with the high threshold voltage p-channel MOSFET M13 and n-channel MOSFET M14, the leakage current to the CMOS logic circuit 3 is prevented from flowing in a sleep mode (with a sleep signal SL at "H" level), thereby reducing the power consumption. In this figure, *SL denotes the inverted signal of the sleep signal SL.

FIG. 2 shows another circuit proposed in U.S. patent application No. 08/495,785, now U.S. Pat. No. 5,594,371. This is an improved circuit of FIG. 1, in which the high-potential and low-potential power supply controllers 4 and 5 are provided with the MOSFETs M13 and M14 with their backgate (substrate) terminals connected to their gate terminals.

Connecting the backgate terminal to the gate terminal realizes variable threshold voltage MOSFETs. This is because the threshold voltages of the MOSFET M13 and M14 are reduced in the active mode owing to the backgate effect in which the threshold voltage of a MOSFETs is changed by a voltage applied to its backgate terminal. This makes it possible to further reduce the supply voltage in the circuit of FIG. 2.

Although there are provided the quasi-power supply lines 41 and 51, and the high threshold voltage MOSFETs M13 and M14 at both high-potential and low-potential sides of the low threshold voltage CMOS logic circuit 3, they can be provided only at one side of the CMOS logic circuit 3.

Incidentally, the same integrated circuit may be used not only with a low voltage power supply, but also with a wide supply voltage range from less than 1V up to 3V to 5V.

Let us consider the high threshold voltage n-channel MOSFET M14 for controlling the power supply in FIG. 2. The following explanation can be applied to the other high threshold voltage MOSFET M13 in a similar manner. The n-channel MOSFET M14 has a p-semiconductor backgate region (a substrate or well in a bulk MOS structure). As a result, a parasitic diode D3 is formed across the backgate region B and the source S. Thus, the MOSFET M14 as shown in FIG. 3A has an equivalent circuit as shown in FIG. 3B.

The parasitic diode D3 will conduct when the gate-source voltage Vgs of the MOSFET M14 exceeds the forward voltage Vf of the parasitic diode D3. The forward voltage Vf is defined as a voltage at which current begins to flow through the diode 3 when an increasing forward voltage is applied thereto, and is about 0.8V in this case. Thus, a passage is formed through the gate terminal, backgate terminal and parasitic diode D3, thereby sharply increasing the gate current.

When the inverted sleep signal *SL=Vgs=VDD, the power control MOSFET M14 in FIG. 2 is in the ON state. Accordingly, if VDD is equal to or greater than Vf, power supply to the low threshold voltage CMOS logic circuit 3 is impossible in the circuit of FIG. 2.

FIG. 4 shows a conventional example of a CMOS logic circuit capable of operating at a high speed with a supply voltage less than 1V close to the threshold voltage of the MOSFETs. The circuit is taught by T. Andoh, et al., "Design Methodology for Low-Voltage MOSFETs", IEDM Technical Digest, pp. 79–82, 1994.

The circuit of FIG. 4 is a CMOS inverter consisting of a p-channel MOSFET M3 and an n-channel MOSFET M4, with their gate terminals and backgate terminals connected in common. The reference numerals 14 and 15 denote a signal input terminal and a signal output terminal, respectively.

The backgate region (n-type semiconductor) and the source region (p-type semiconductor) are forwardly biased in the p-channel MOSFET M3, when a low level voltage (equal to ground voltage) is applied to the gate terminal via the signal input terminal 14 because the voltage of the backgate terminal connected to the gate terminal is also reduced.

On the other hand, the backgate region (p-type semiconductor) and the source region (n-type semiconductor) are forwardly biased in the n-channel MOSFET M4, when a high level voltage (equal to the supply voltage VDD) is applied to the gate terminal via the signal input terminal 14 because the voltage of the backgate terminal connected to the gate terminal is also increased.

In MOSFETs, either in the p-channel or n-channel MOSFETs, the forward bias applied across the backgate region and the source region will reduce the depletion layer in the backgate region. The threshold voltage of a MOSFET is determined by a ratio of the charge density $Q_B$ to the gate capacitance $C_{OX}$, and hence the threshold voltage decreases with a reduction in the depletion layer width and $Q_B$. In this case, the absolute value of the threshold voltage of the p-channel MOSFET reduces.

Thus, when the high level voltage is applied to the signal input terminal 14 of the CMOS inverter in FIG. 4, that is, when the n-channel MOSFET M4 is turned on, the threshold voltage of only the n-channel MOSFET M4 is reduced. Reversely, when the low level voltage is applied to the signal input terminal 14, that is, when the p-channel MOSFET M3 is turned on, the threshold voltage of only the p-channel MOSFET M3 is reduced. Since the reduced threshold voltage will further increase the current driving power, a supply voltage less than 1V close to the normal threshold voltage can achieve high speed operation.

The circuit as shown in FIG. 4, however, presents the following problem. Let us consider a circuit of FIG. 5, in which three CMOS inverters as shown in FIG. 4 are connected in cascade. When the low level voltage L and the high level voltage H are applied as shown in FIG. 5, the input terminal to the inverter #3 is placed at the low level. Thus, the gate voltage of the p-channel MOSFET M33 equals the ground potential, and its source voltage equals the supply voltage VDD.

Therefore, a forward biased parasitic diode is formed in the p-channel MOSFET M33, with its anode being the source (p-type semiconductor) and its cathode being the backgate terminal (n-type semiconductor). On the other hand, the n-channel MOSFET M42 of the inverter #2 at the preceding stage is in the ON state because its gate voltage is placed at the supply voltage.

As a result, a short-circuit current flows from the power supply terminal to the ground terminal through a passage as shown by the broken lines passing through the power supply terminal, the source (p-type semiconductor) of the conductive p-channel MOSFET M33, the backgate terminal (n-type semiconductor) of the MOSFET M33, the drain of the conductive n-channel MOSFET M42, the source of the MOSFET M42 and the ground.

Likewise, a short-circuit current flows through the power supply terminal, the source of the conductive p-channel MOSFET M31, the drain of the MOSFET M31, the backgate terminal (p-type semiconductor) of the conductive n-channel MOSFET M42, the source (n-type semiconductor) of the MOSFET M42, and the ground.

As a result, the circuit of FIG. 5 cannot normally operate with a supply voltage higher than the forward voltage Vf (for example, 0.8V) owing to a sharp increase in the leakage current of the CMOS logic circuit, which is caused by a quick increase in the forward current of the pn-junction diode, which exhibits an exponential increase beyond the forward voltage Vf. Thus, the circuit as shown in FIG. 5 has a problem in that its supply voltage is limited to within the forward voltage Vf.

SUMMARY OF THE INVENTION

It is therefore an object of the present invention to provide a MOSFET which conducts no substantial current through the parasitic diode irrespective of the supply voltage, whether it is greater than or less than the forward voltage of the parasitic diode across the source region and the backgate region, thereby eliminating the problems described above.

Another object of the present invention is to provide CMOS logic circuits that can achieve high speed operation and low power consumption in a wide supply voltage range.

In a first aspect of the present invention, there is provided a MOSFET circuit comprising:

a first MOSFET having a first threshold voltage; and a second MOSFET having a second threshold voltage lower than or equal to the first threshold voltage, the second MOSFET having a gate electrode and a first main current electrode connected to a backgate electrode of the first MOSFET, and a second main current electrode connected to an external signal.

Here, the first main current electrode may be a source electrode, and the second main current electrode may be a drain electrode.

A gate electrode of the first MOSFET may be connected to the second main current electrode of the second MOSFET.

The second threshold voltage may be lower than the first threshold voltage.

The second threshold voltage may be equal to the first threshold voltage.

In a second aspect of the present invention, there is provided a CMOS logic circuit including a series connection of a load transistor and a driver transistor, one of the driver transistor and the load transistor including a first MOSFET circuit, the first MOSFET circuit comprising:

a first MOSFET having a first threshold voltage, and being connected to the other of the driver transistor and the load transistor; and a second MOSFET having a second threshold voltage lower than the first threshold voltage, and having a gate electrode and a first main current electrode connected to a backgate electrode of the first MOSFET, and a second main current electrode connected to a gate electrode of the first MOSFET.

Here, the other of the driver transistor and the load transistor may be a MOSFET, and the CMOS logic circuit may be a CMOS inverter.

The load transistor may comprise M (M is an integer greater than one) MOSFETs connected in series, and the driver transistor may comprise M the first MOSFET circuits connected in parallel, and the CMOS logic circuit may be a NOR circuit.

The load transistor may comprise M (M is an integer greater than one) MOSFETs connected in parallel, and the driver transistor may comprise M the first MOSFET circuits connected in series, and the CMOS logic circuit may be a NAND circuit.

The other of the driver transistor and the load transistor may include a second MOSFET circuit, the second MOSFET comprising:

a third MOSFET having a third threshold voltage, and being connected with the first MOSFET circuit in series; and a fourth MOSFET having a fourth threshold voltage lower than the third threshold voltage, and having a gate electrode and a first main current electrode connected to a backgate electrode of the third MOSFET, and a second main current electrode connected to a gate electrode of the third MOSFET.

Here, the CMOS logic circuit may be a CMOS inverter.

The driver transistor may comprise M (M is an integer greater than one) first MOSFET circuits connected in parallel, and the load transistor may comprise M second MOSFET circuits connected in series, and the CMOS logic circuit may be a NOR circuit.

The driver transistor may comprise M (M is an integer greater than one) first MOSFET circuits connected in series, and the load transistor may comprise M second MOSFET circuits connected in parallel, and the CMOS logic circuit may be a NAND circuit.

In a third aspect of the present invention, there is provided a buffer circuit including a first CMOS inverter and a second CMOS inverter alternately connected in cascade, wherein a load transistor of the first CMOS inverter comprises:
  a first MOSFET having a first threshold voltage, and being connected with a driver transistor of the first CMOS inverter in series; and
  a second MOSFET having a second threshold voltage lower than the first threshold voltage, and having a gate electrode and a first main current electrode connected to a backgate electrode of the first MOSFET, and a second main current electrode connected to a gate electrode of the first MOSFET, and wherein a driver transistor of the second CMOS inverter comprises:
  a third MOSFET having a third threshold voltage, and being connected with a load transistor of the second CMOS inverter in series; and
  a fourth MOSFET having a fourth threshold voltage lower than the third threshold voltage, and having a gate electrode and a first main current electrode connected to a backgate electrode of the third MOSFET, and a second main current electrode connected to a gate electrode of the third MOSFET.

In a fourth aspect of the present invention, there is provided a CMOS logic circuit including a low threshold CMOS logic circuit and at least one switching circuit, the low threshold CMOS logic circuit including MOSFETs with a threshold voltage lower than a first threshold voltage, and the switching circuit being connected between a power supply terminal of the low threshold CMOS logic circuit and a power supply, wherein the switching circuit comprises:

a first MOSFET having the first threshold voltage, and being connected between the power supply and the power supply terminal of the low threshold CMOS logic circuit; and
  a second MOSFET having a second threshold voltage lower than the first threshold voltage, and having a gate electrode and a first main current electrode connected to a backgate electrode of the first MOSFET, and a second main current electrode connected to a gate electrode of the first MOSFET.

Here, the switching circuit may be connected between a high potential terminal of the power supply and a high potential power supply terminal of the low threshold CMOS logic circuit.

The switching circuit may be connected between a low potential terminal of the power supply and a low potential power supply terminal of the low threshold CMOS logic circuit.

The switching circuit may be further connected between a low potential terminal of the power supply and a low potential power supply terminal of the low threshold CMOS logic circuit.

The CMOS logic circuit may be switched between a sleep mode and an active mode by a sleep signal externally fed, and may further comprise a first buffer connected to a non-inverted sleep signal input terminal of the CMOS logic circuit, and a second buffer connected to an inverted sleep signal input terminal of the CMOS logic circuit, wherein the first buffer comprises a first CMOS inverter and a second CMOS inverter alternately connected in cascade, and a load transistor of the first CMOS inverter comprises:
  a first MOSFET having the first threshold voltage, and being connected with a driver transistor of the first CMOS inverter in series; and
  a second MOSFET having a second threshold voltage lower than the first threshold voltage, and having a gate electrode and a first main current electrode connected to a backgate electrode of the first MOSFET, and a second main current electrode connected to a gate electrode of the first MOSFET, wherein a driver transistor of the second CMOS inverter comprises:
  a third MOSFET having a third threshold voltage, and being connected with a load transistor of the second CMOS inverter in series; and
  a fourth MOSFET having a fourth threshold voltage lower than the third threshold voltage, and having a gate electrode and a first main current electrode connected to a backgate electrode of the third MOSFET, and a second main current electrode connected to a gate electrode of the third MOSFET, and wherein the second buffer comprises the second CMOS inverter and the first CMOS inverter alternately connected in cascade.

The CMOS logic circuit may be switched between a sleep mode and an active mode by a sleep signal externally fed, and may further comprise a buffer connected to a non-inverted sleep signal input terminal of the CMOS logic circuit, wherein the buffer comprises a first CMOS inverter and a second CMOS inverter alternately connected in cascade, and a load transistor of the first CMOS inverter comprises:
  a first MOSFET having the first threshold voltage, and being connected with a driver transistor of the first CMOS inverter in series; and
  a second MOSFET having a second threshold voltage lower than the first threshold voltage, and having a gate electrode and a first main current electrode connected to a backgate electrode of the first MOSFET, and a second main current electrode connected to a gate electrode of the first MOSFET, and wherein a driver transistor of the second CMOS inverter comprises:
  a third MOSFET having a third threshold voltage, and being connected with a load transistor of the second CMOS inverter in series; and
  a fourth MOSFET having a fourth threshold voltage lower than the third threshold voltage, and having a gate electrode and a first main current electrode connected to a backgate electrode of the third MOSFET, and a second main current electrode connected to a gate electrode of the third MOSFET.

The CMOS logic circuit may be switched between a sleep mode and an active mode by a sleep signal externally fed, and further may comprise a buffer connected to an inverted sleep signal input terminal of the CMOS logic circuit, wherein the buffer comprises a first CMOS inverter and a second CMOS inverter alternately connected in cascade, wherein a driver transistor of the first CMOS inverter comprises:
  a first MOSFET having the first threshold voltage, and being connected with a load transistor of the first CMOS inverter in series; and
  a second MOSFET having a second threshold voltage lower than the first threshold voltage, and having a gate electrode and a first main current electrode connected to a backgate electrode of the first MOSFET, and a second main current electrode connected to a gate electrode of the first MOSFET, and wherein a load transistor of the second CMOS inverter comprises:

a third MOSFET having a third threshold voltage, and being connected with a driver transistor of the second CMOS inverter in series; and a fourth MOSFET having a fourth threshold voltage lower than the third threshold voltage, and having a gate electrode and a first main current electrode connected to a backgate electrode of the third MOSFET, and a second main current electrode connected to a gate electrode of the third MOSFET.

In a fifth aspect of the present invention, there is provided a CMOS logic circuit comprising:

an internal CMOS logic circuit including a set of M (M is an integer equal to or greater than one) driver transistors and a set of M load transistors, the internal CMOS logic circuit changing its operation mode in response to an external control signal; and a first MOSFET connected to a first MOSFET circuit constituting one of the set of driver transistors and the set of load transistors, wherein the first MOSFET has a same channel type as the first MOSFET circuit, and comprises a gate electrode and a first main current electrode connected to a backgate electrode of the first MOSFET circuit, and a second main current electrode connected to the external control signal.

The CMOS logic circuit may further comprise a second MOSFET connected to a second MOSFET circuit constituting the other of the set of driver transistors and the set of load transistors, wherein the second MOSFET may have a same channel type as the second MOSFET circuit, and may comprise a gate electrode and a first main current electrode connected to a backgate electrode of the second MOSFET circuit, and a second main current electrode connected to an inverted signal of the external control signal.

A threshold voltage of each of the first MOSFET and the second MOSFET may be lower than a threshold voltage of MOSFETs included in the internal CMOS logic circuit.

The internal CMOS logic circuit may comprise one or more CMOS inverters.

The internal CMOS logic circuit may comprise a transmission gate.

The internal CMOS logic circuit may comprise a memory cell, and the control signal may be a word line signal.

The control signal may be a sleep signal which switches a mode of the internal CMOS logic circuit into a sleep mode or into an active mode.

Each MOSFET of the CMOS logic circuit may be a SOIFET which is formed on a SOI (Semiconductor On Insulator) substrate.

Carrier concentration of a body of each the low threshold MOSFET may be controlled such that the body becomes a fully depleted state.

Carrier concentration of a body of each the low threshold MOSFET may be controlled such that the body becomes a partially depleted state.

According to one aspect of the present invention, the second MOSFET connected between the gate terminal and the backgate terminal of the first MOSFET functions as a reverse biased diode, thereby preventing a substantial current from flowing from the gate terminal to the backgate terminal. As a result, even if the supply voltage exceeds the forward voltage Vf of the parasitic diode formed between the source terminal and the backgate terminal of the first MOSFET, the parasitic diode does not conduct, which makes it possible to employ a high supply voltage. In addition, since the first MOSFET takes a variable threshold voltage which is reduced in the ON state, high speed operation is possible. Thus, the present invention can provide a high speed, wide supply voltage range MOSFET.

According to another aspect of the present invention, the backgate terminal of each MOSFET in the internal CMOS logic circuit is connected to the control terminal through the second MOSFET (a rectifier element). As a result, the rectifier element is reversely biased when the forward bias is applied to the backgate region and the source region of each MOSFET in the internal CMOS logic circuit by the control signal fed to the control terminal.

Thus, when the rectifier element is reversely biased by the control signal applied to the backgate terminals, the MOSFETs are forwardly biased by the leakage current flowing through the rectifier element, thereby reducing the threshold voltage, and increasing the driving power of the MOSFETs. This makes it possible for the CMOS logic circuit to use a low supply voltage, and to achieve high speed operation. This mode is suitable for an active mode. In this case, since the current flowing through the backgate region is limited by the rectifier element, it does not increase sharply even if the supply voltage exceeds the forward voltage Vf between the backgate region and the source region.

In contrast, when the rectifier element is forwardly biased by the control signal applied to the backgate terminal, a reverse bias is applied to the MOSFETs by the current flowing through the rectifier element. Thus, the reduction in the threshold voltage does not occur, thereby achieving the reduction in the leakage current of the MOSFETs, and the power consumption. Thus, this mode is suitable for the sleep mode.

The above and other objects, effects, features and advantages of the present invention will become more apparent from the following description of the embodiments thereof taken in conjunction with the accompanying drawings.

BRIEF DESCRIPTION OF THE DRAWINGS

FIGS. 3A and 3B are circuit diagrams illustrating the operation of the n-channel MOSFET M14 as shown in FIG. 2, wherein FIG. 3A is a circuit diagram showing the MOSFET M14 in its single form, and FIG. 3B shows an equivalent circuit of the MOSFET M14;

FIGS. 6A and 6B are circuit diagrams showing a first embodiment of a MOSFET in accordance with the present invention, wherein FIG. 6A shows an n-channel MOSFET, and FIG. 6B shows a p-channel MOSFET;

FIGS. 7A–7D are diagrams illustrating the operation of the n-channel MOSFET 112 as shown in FIG. 6A;

FIGS. 9A and 9B are views showing a SOI p-channel MOSFET 112, wherein FIG. 9A is a plan view, and FIG. 9B is a cross-sectional view taken along the line 9B—9B of FIG. 9A;

FIGS. 12A and 12B are views showing a bulk p-channel MOSFET 112, wherein FIG. 12A is a plan view, and FIG. 12B is a cross-sectional view taken along the line 12B—12B of FIG. 12A;

FIGS. 15A and 15B are circuit diagrams showing CMOS inverters in accordance with a second embodiment of the present invention, wherein FIG. 15A shows an inverter using the MOSFET of the first embodiment as its driver transistor, and FIG. 15B shows an inverter employing the MOSFET of the first embodiment as its load transistor;

FIGS. 16A and 16B are block diagrams showing variations of the second embodiment of the present invention, wherein FIG. 16A shows a NOR circuit, and FIG. 16B shows a NAND circuit;

FIGS. 18A and 18B are block diagrams showing CMOS logic circuits in accordance with the third embodiment of the present invention, wherein FIG. 18A shows a NOR gate, and FIG. 18B shows a NAND gate;

DETAILED DESCRIPTION OF PREFERRED EMBODIMENTS

The invention will now be described with reference to the accompanying drawings.

EMBODIMENT 1

Figure 6A:
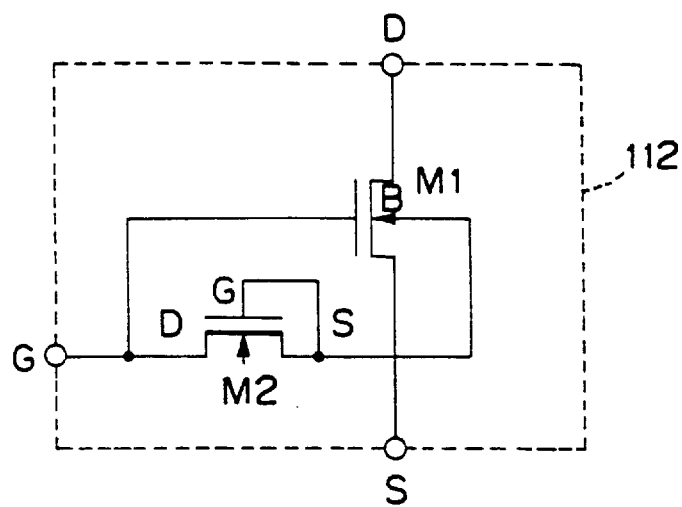
Figure 6B:
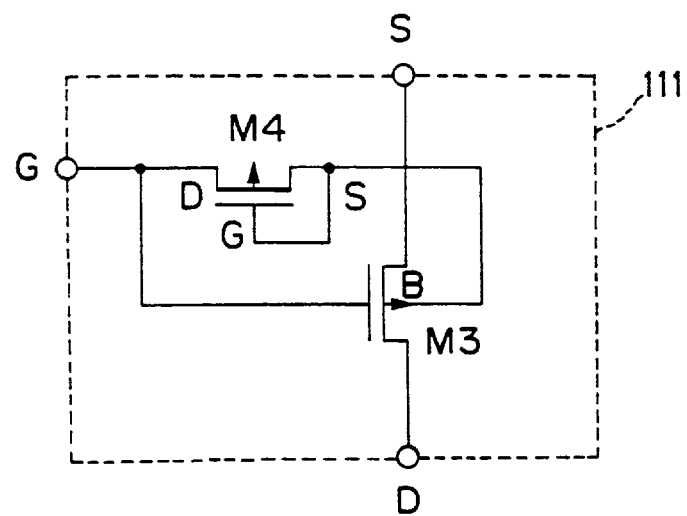

FIGS. 6A and 6B show MOSFETs in accordance with a first embodiment of the present invention. FIG. 6A shows an n-channel MOSFET circuit 112 comprising a high threshold voltage n-channel MOSFET M1 and a low threshold voltage n-channel MOSFET M2. The drain terminal D of the MOSFET M2 is connected to the gate terminal G of the MOSFET M1, and the source terminal S and the gate terminal G of the MOSFET M2 are connected to the backgate terminal (substrate) B of the MOSFET M1.

FIG. 6B, on the other hand, shows a p-channel MOSFET circuit 111 comprising a high threshold voltage p-channel MOSFET M3 and a low threshold voltage p-channel MOSFET M4. The drain terminal D of the MOSFET M4 is connected to the gate terminal G of the MOSFET M3, and the source terminal S and the gate terminal G of the MOSFET M4 are connected to the backgate terminal (substrate) B of the MOSFET M3.

It is sufficient for the low threshold voltage MOSFETs M2 and M4 that their channel width is about $1/100$ of that of the high threshold voltage MOSFETs M1 and M3. This is because a demand for the MOSFETs M2 and M4 is fully satisfied only if they function as a diode. In addition, since they occupy only a very small area, an area increase involved in adding the MOSFETs M2 and M4 is very slight.

The n-channel MOSFET circuit 112 as shown in FIGS. 6A and 7A has an equivalent circuit as shown in FIG. 7B when its drain terminal D is provided with the supply voltage VDD, its gate terminal G is supplied with an input voltage Vin and its source terminal is grounded.

As described above, since an enhancement n-channel MOSFET has a backgate regions of p-type semiconductor, a parasitic diode D3 is formed across the backgate terminal B and the source terminal S of the high threshold voltage MOSFET M1. The low threshold voltage MOSFET M2 functions as a diode with its drain terminal D (or source terminal S) and gate terminal G being the anode, and its source terminal S (or drain terminal D) being the cathode.

The forward voltage Vf of the diode D3 is approximately 0.8V, whereas the forward voltage Vf of a diode D1 formed by the low threshold voltage MOSFET M2 equals the threshold voltage of the MOSFET M2 (about 0.2V).

Next, the operation of the MOSFET circuit 112 will be described.

(1) When the input voltage Vin (Vgs)=VDD

Figure 8:
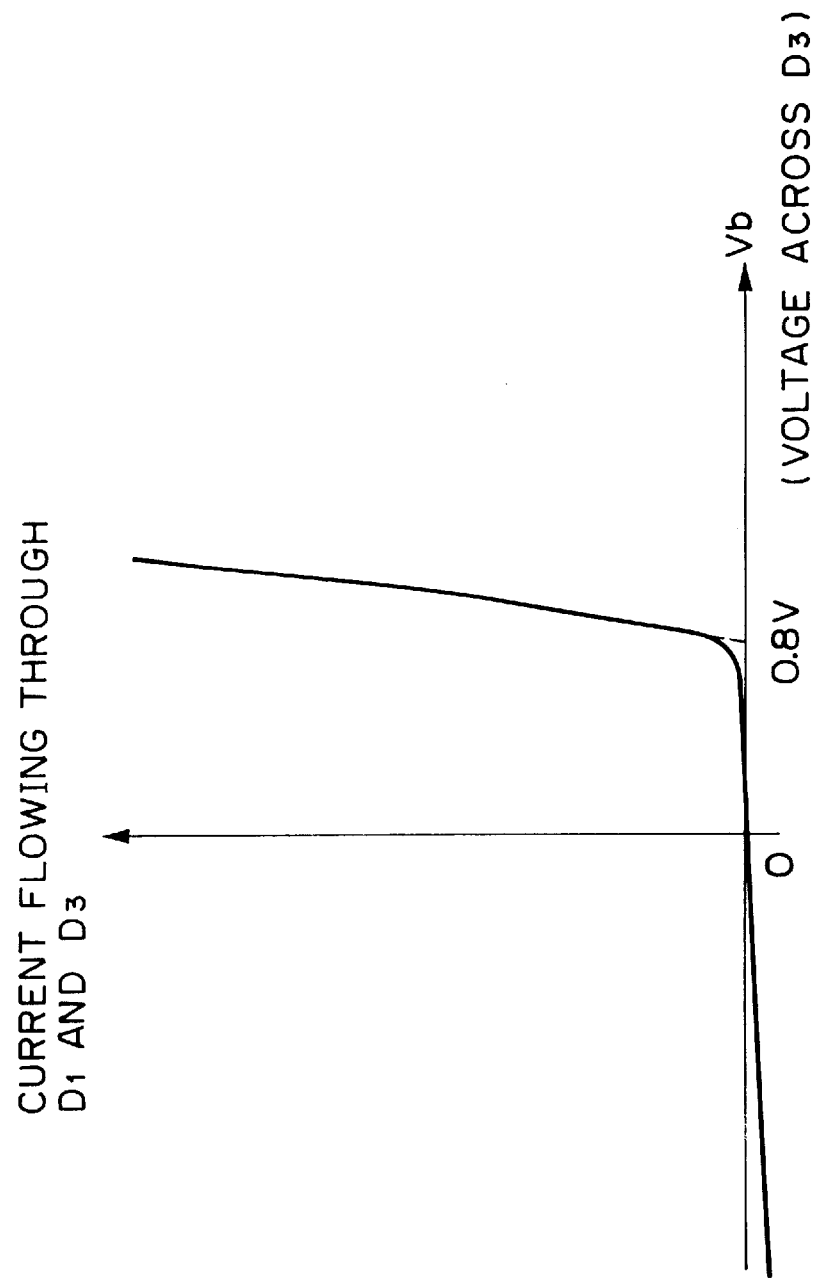
FIG. 8 is a graph illustrating the clamping operation of the backgate voltage in the n-channel MOSFET 112.

In this case, the MOSFET circuit 112 is turned on, and its equivalent circuit is as shown in FIG. 7C. The forward current i3 of the diode D3 is limited by the leakage current of the diode D1. Specifically, the anode potential Vb of the diode D3 is limited to less than 0.8V by the dark current of the diode D1. Thus, although the voltage Vb of the backgate terminal becomes positive, it cannot exceed the forward voltage Vf of the diode D3 because it is clamped by the dark current of the diode D1, and is kept within $0<Vb \leq 0.8V$ as shown in FIG. 8. In addition, the positive backgate terminal voltage Vb produces the backgate effect, and hence the threshold voltage of the high threshold voltage MOSFET M1 is reduced. Thus, the ON state resistance of the MOSFET M1 is reduced.

Furthermore, the current from the gate terminal to the backgate terminal is intercepted by the reversely connected diode D1. This makes it possible to prevent the large current which flows through the gate terminal G, backgate terminal B and source terminal S of the MOSFET M1 in the conventional circuit when VDD>0.8V and the diode D3 conducts.

(2) When the input voltage Vin (Vgs)=0

In this case, the MOSFET circuit 112 is turned off, and its equivalent circuit is as shown in FIG. 7D. Both diodes D1 and D3 are cut off, resulting in the backgate terminal voltage Vb=0. As a result, the high threshold voltage MOSFET M1 does not produce the backgate effect, and its threshold voltage is kept high.

Thus, a supply voltage VDD>0.8V can achieve a variable bias of the MOSFET M1. In other words, the MOSFET M1 takes the high threshold voltage when the input voltage Vin=0, whereas it takes the low threshold voltage when Vin=VDD.

FIGS. 9A and 9B show a structure of the n-channel MOSFET circuit 112 formed on a SOI integrated circuit. FIG. 9A is a plan view, and FIG. 9B is a cross-sectional view taken along the line A—A in FIG. 9A. The reference numerals 21, 22, 23, 24 and 25 designate the drain, the source, the gate, the body under the gate 23, and the backgate terminal of the high threshold voltage n-channel MOSFET M1, respectively. The body refers to the p-region of an n-channel SOI MOSFET or the n-region of a p-channel SOI MOSFET, and corresponds to the backgate region in a-bulk structure. The reference numerals 26, 27, 28 and 29 designate the source, the drain, the gate, and the body under the gate 28 of the low threshold voltage n-channel MOSFET M2, respectively. The reference numerals 30, 31, 32 and 33 designate wiring metals, a silicon substrate, a buried oxide and contact holes, respectively.

The body 24 of the high threshold voltage MOSFET M1 is connected to the gate 28 and source 26 of the low threshold voltage MOSFET M2 through the backgate terminal 25 and the wiring metal 30. In contrast, the body 29 of the low threshold voltage MOSFET M2 is not connected to its backgate terminal, but is made floating. The SOI MOSFET is characterized in that its body can be made floating without providing a well for each MOSFET which is needed in the bulk MOSFET.

The floating of the body increases the potential of the body, thereby decreasing the threshold voltage. Thus, in terms of the SOI MOSFET, high threshold voltage MOSFETs and low threshold voltage MOSFETs can be fabricated depending on whether the body is biased or not without using a special mask for adjusting the threshold voltage in the fabrication process.

Figure 10:
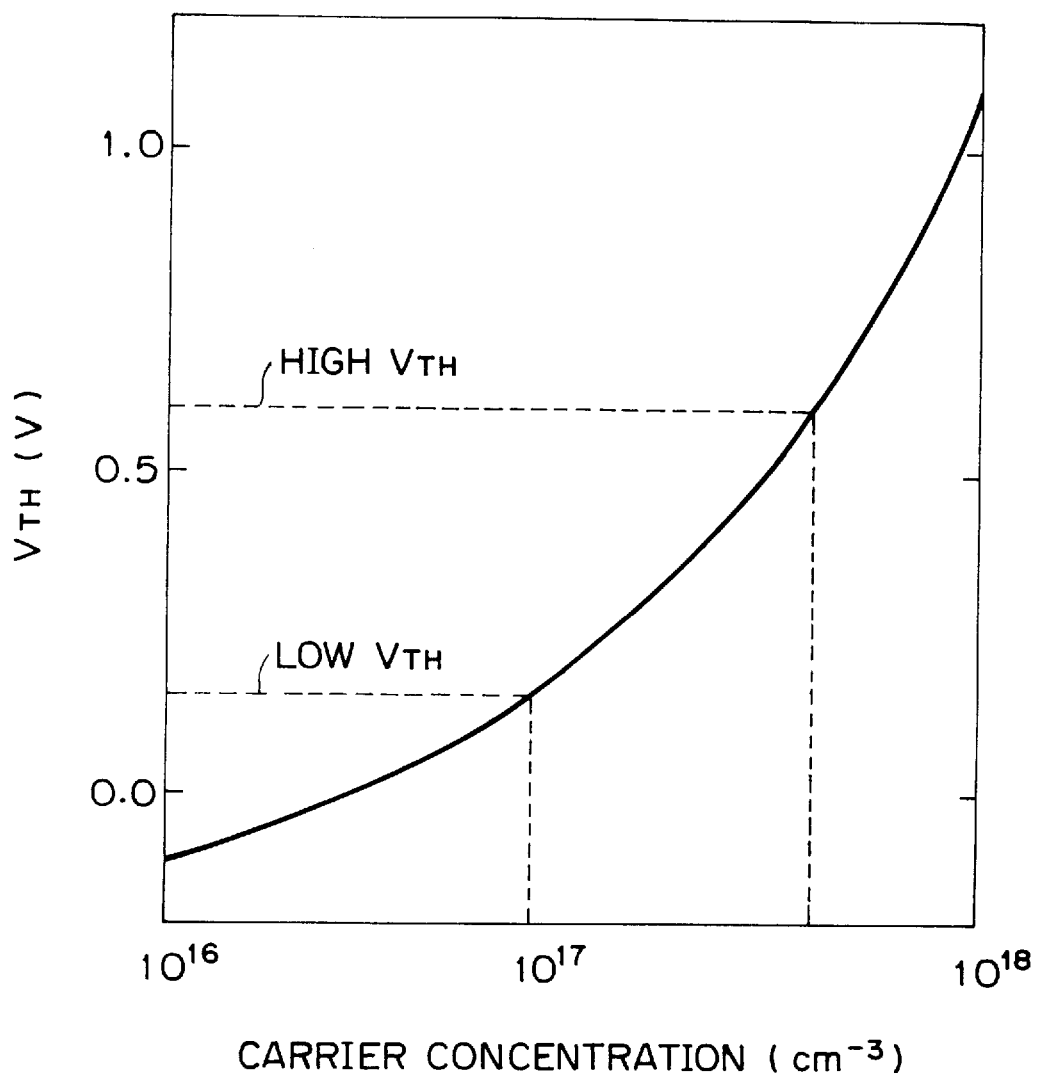
FIG. 10 is a graph illustrating relationships between the carrier concentration of the body and the threshold voltage of the n-channel MOSFET 112.

Apart from this, the threshold voltage of the MOSFET can be adjusted at higher accuracy by controlling the carrier concentration in the body. FIG. 10 shows the relationships of the carrier concentration and the threshold voltage. A decrease in the carrier concentration results in an increase in the depletion layer width W, and reduces the voltage needed for forming the channel, thereby reducing the threshold voltage.

Figure 11A:
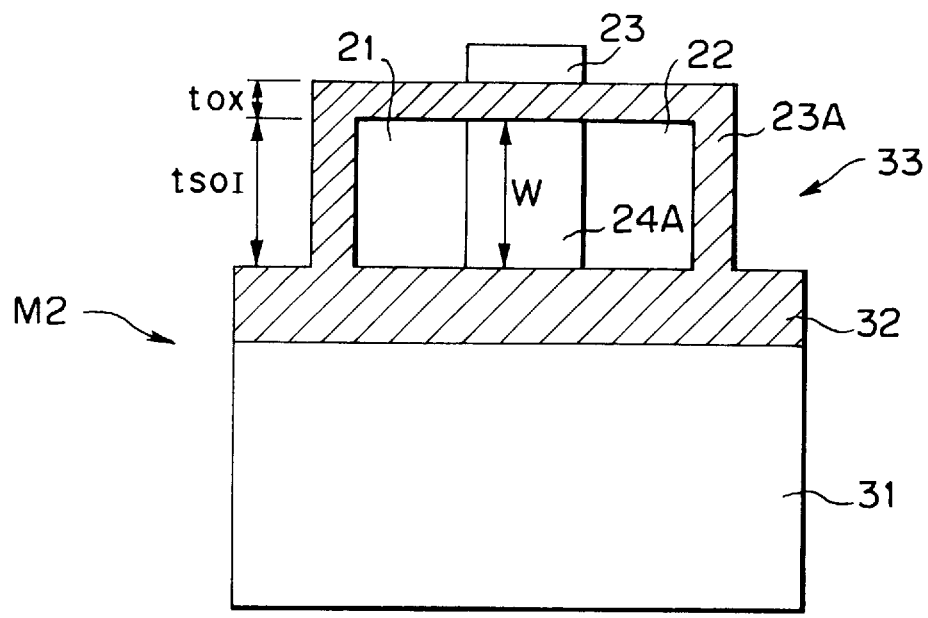
FIG. 11A is a schematic cross-sectional view illustrating the depletion layer width W of the body of the low threshold voltage SOI MOSFET of the first embodiment.
Figure 11B:
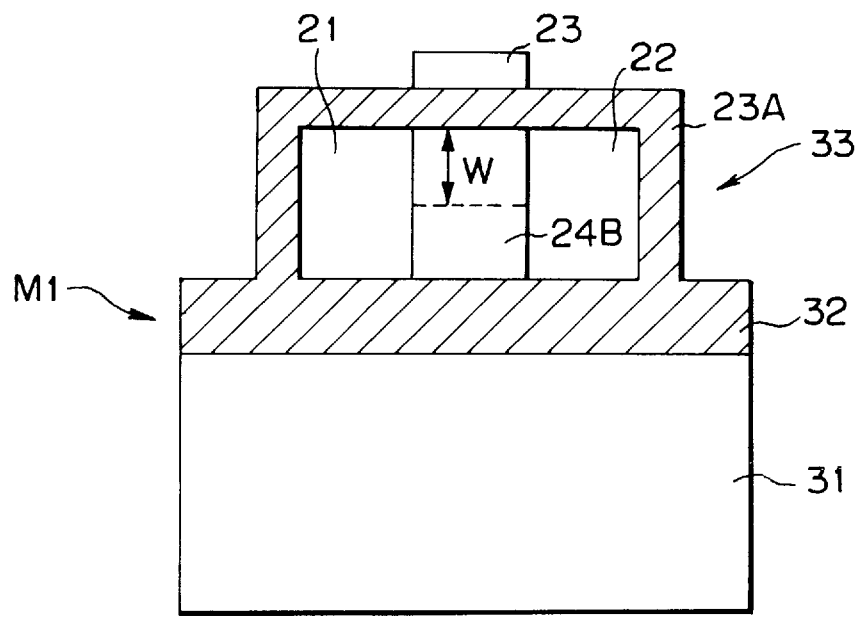
FIG. 11B is a schematic cross-sectional view illustrating the depletion layer width W of the body of the high threshold voltage SOI MOSFET of the first embodiment.

FIG. 11A illustrates the state in which the carrier concentration is decreased to increase the depletion layer width W so that the body 24A is fully depleted. In this state, the threshold voltage is reduced. In contrast, FIG. 11B illustrates the state in which the carrier concentration is increased to decrease the depletion layer width W so that the body 24B is partially depleted. In this state, the threshold voltage is increased.

Thus, the body 29 of the low threshold voltage MOSFET M2 is made fully depleted as shown in FIG. 11A, and the body 24 of the high threshold voltage MOSFET M1 is made partially depleted as shown in FIG. 11B. The full depletion layer of the low threshold voltage MOSFET M2 results in an increase in its mutual inductance and reduction in the gate capacitance, thereby markedly improving the operating speed.

FIGS. 12A and 12B show the n-channel MOSFET 112 as shown in FIG. 6A, which is implemented in a bulk structure. The bulk MOSFET includes an n+ buried layer and a p-well formed in a p-silicon substrate, and backgate regions of the MOSFETs M1 and M2 formed in the p-well.

Figure 13A:
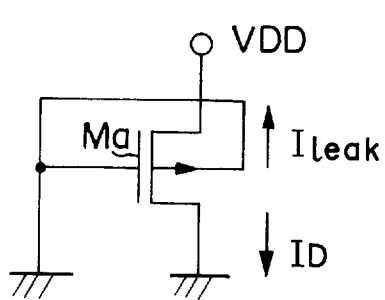
FIGS. 13A and 13B are diagrams illustrating characteristics of the MOSFET of the conventional circuit.
Figure 13C:
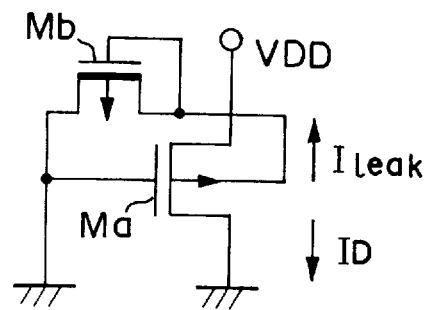
FIGS. 13C and 13D are diagrams illustrating characteristics of the MOSFET of the first embodiment.
Figure 13B:
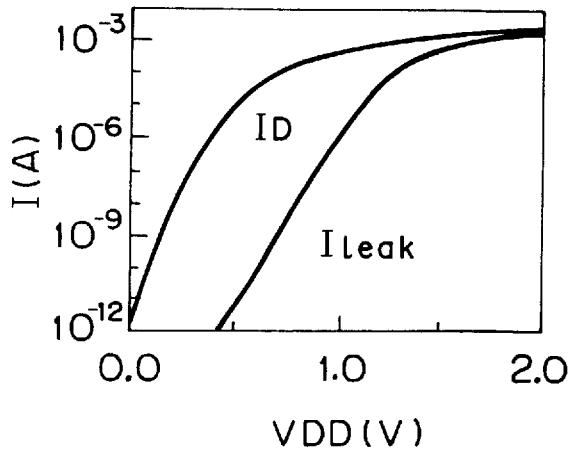
Figure 13D:
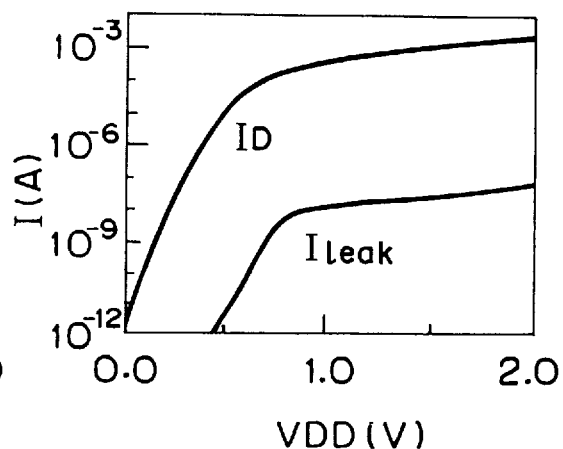

FIGS. 13A–13D are diagrams illustrating results of this embodiment. FIGS. 13A and 13B show the circuit arrangement of a conventional MOSFET, and its current characteristics, and FIGS. 13C and 13D show the circuit arrangement of the MOSFET in accordance with the present invention, and its current characteristics. As shown in FIGS. 13A and 13B, the leakage current $I_{leak}$ increases exponentially in a conventional n-channel MOSFET Ma whose gate terminal is directly connected to its backgate terminal, because the backgate potential increases in proportion to the supply voltage VDD. In contrast with this, an increase in the leakage current can be suppressed in the n-channel MOSFET Ma in accordance with the present invention, whose gate terminal is connected to its backgate terminal through a low threshold voltage n-channel rectifier MOSFET Mb. This is because the rectifier MOSFET Mb is reversely biased, and hinders the current increase. In the case where the supply voltage is 1V, the circuit in accordance with the present invention can reduce the leakage current by four orders in magnitude in comparison with the conventional circuit.

Figure 14A:
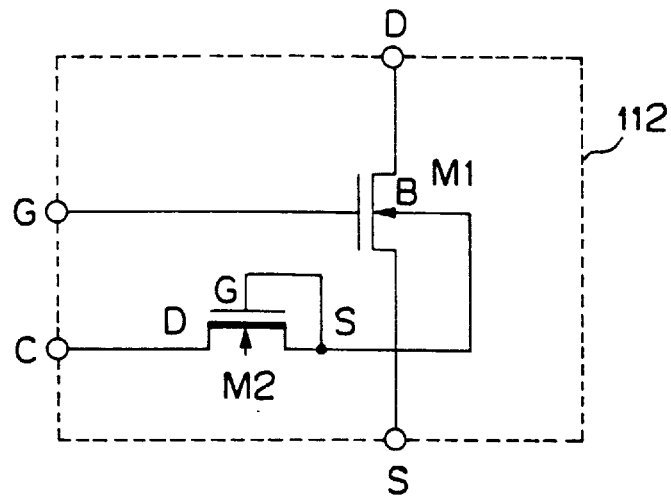
FIGS. 14A and 14B are circuit diagrams showing variations of the first embodiment.
Figure 14B:
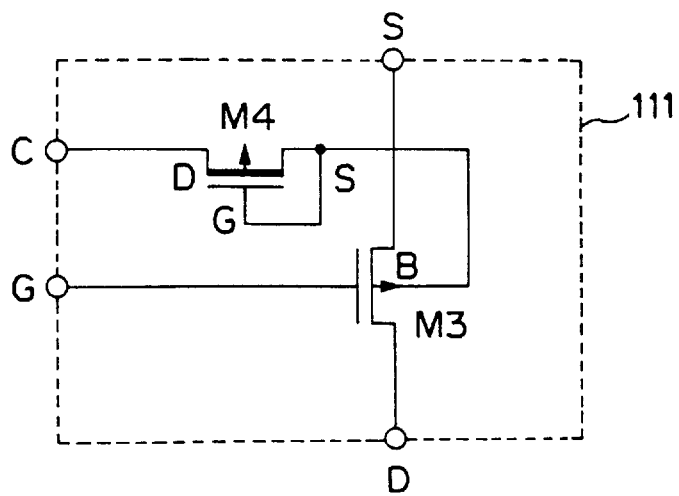

FIG. 14A and 14B show variations of the present embodiment. The MOSFET of FIG. 14A is provided with a control terminal besides the gate terminal of the MOSFET of FIG. 6A, and the gate electrode of the MOSFET M1 is connected to the gate terminal. In addition, the gate of the MOSFET M2 is connected to the control terminal. By thus separating the gate terminal and the control terminal, the operation mode of the MOSFET M1 can be controlled by an external signal. An example of this will be described later.

EMBODIMENT 2

Figure 15A:
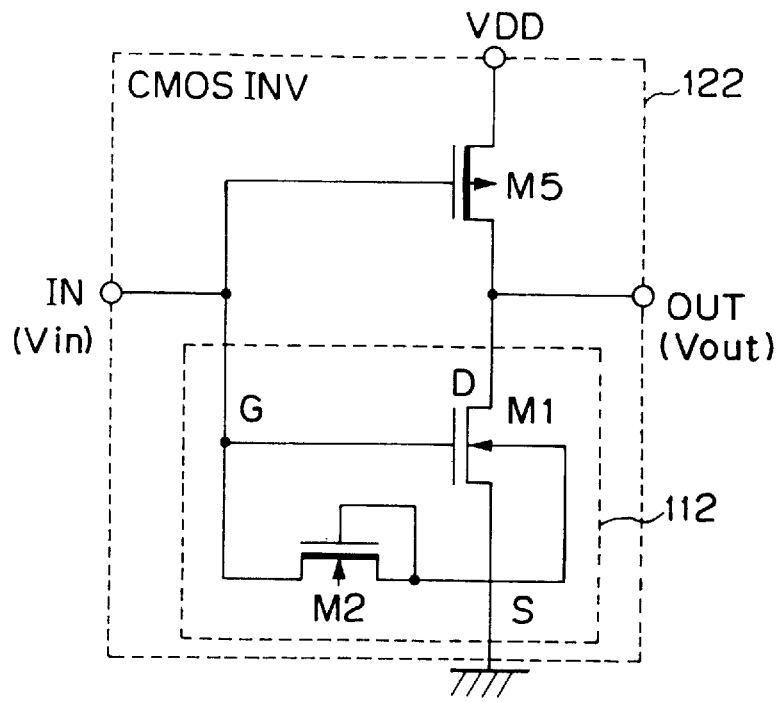
Figure 15B:
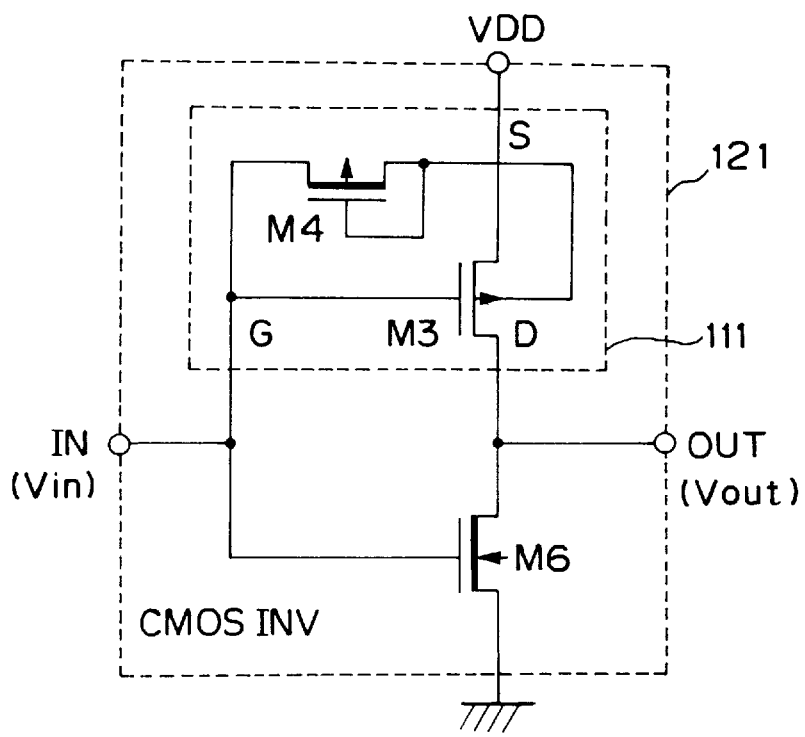

FIGS. 15A and 15B show CMOS inverters 122 and 121 in accordance with a second embodiment of the present invention. FIG. 15A shows the CMOS inverter 122 including a low threshold voltage p-channel MOSFET M5 functioning as the load transistor, and the high threshold voltage n-channel MOSFET circuit 112 as shown in FIG. 6A, which functions as the driver transistor. Likewise, FIG. 15B shows the CMOS inverter 121 including the p-channel MOSFET circuit 111 as shown in FIG. 6B, which functions as the load transistor, and a low threshold voltage n-channel MOSFET M6 functioning as the driver transistor.

Figure 16A:
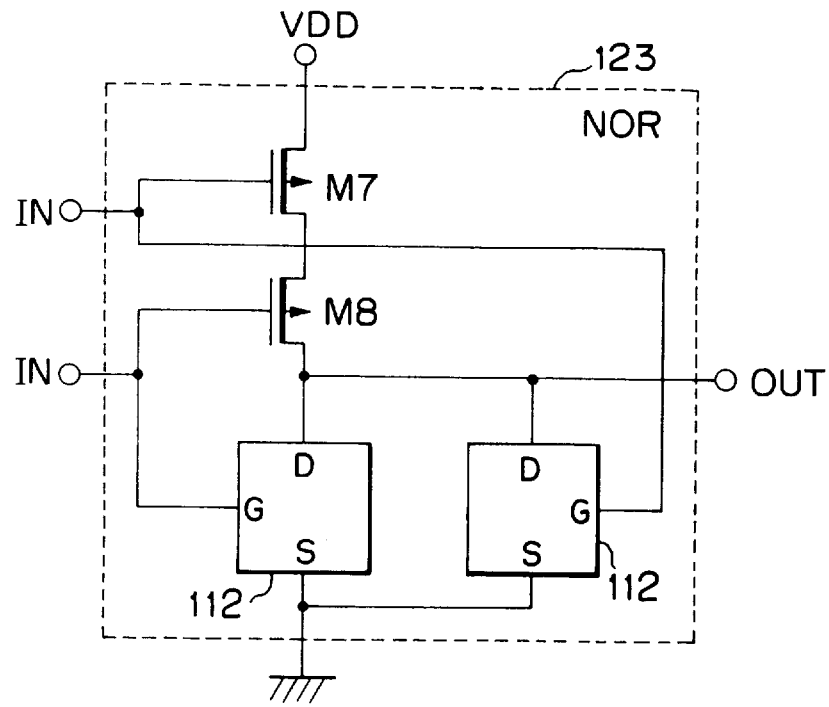
Figure 16B:
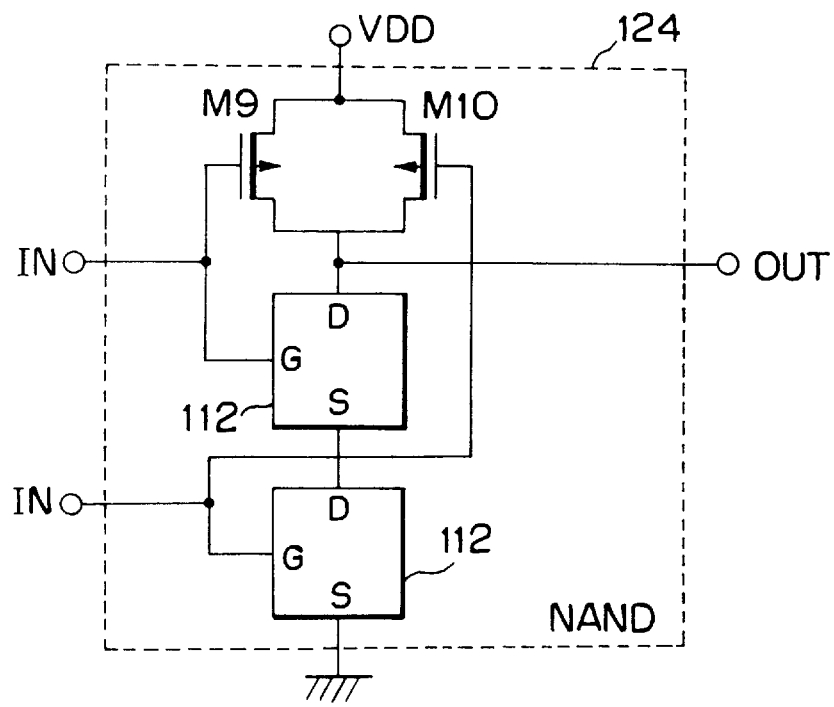

FIGS. 16A and 16B show variations of the second embodiment. FIG. 16A shows a 2-input NOR circuit 123, and FIG. 16B shows a 2-input NAND circuit 124. In FIG. 16A, the 2-input NOR circuit 123 includes two low threshold voltage p-channel MOSFETs M7 and M8 connected in series to form the load transistor, and the two n-channel MOSFETs 112 as shown in FIG. 6A connected in parallel to form the driver transistor. On the other hand, in FIG. 16B, the 2-input NAND circuit 124 includes two low threshold voltage p-channel MOSFETs M9 and M10 connected in parallel to form the load transistor, and the two n-channel MOSFETs 112 as shown in FIG. 6A connected in series to form the driver transistor.

Since the second embodiment uses the n-channel MOSFET circuit 112 as shown in FIG. 6A, and the p-channel MOSFET circuit 111 as shown in FIG. 6B, it can realize variable threshold voltage even with the supply voltage VDD>0.8V by applying the variable bias of the MOSFETs M1 and M2, thereby achieving lower power consumption in a higher supply voltage region.

The low threshold voltage MOSFETs M5–M10 can be replaced by high threshold voltage MOSFETs in FIGS. 15A–16B.

EMBODIMENT 3

Figure 17:
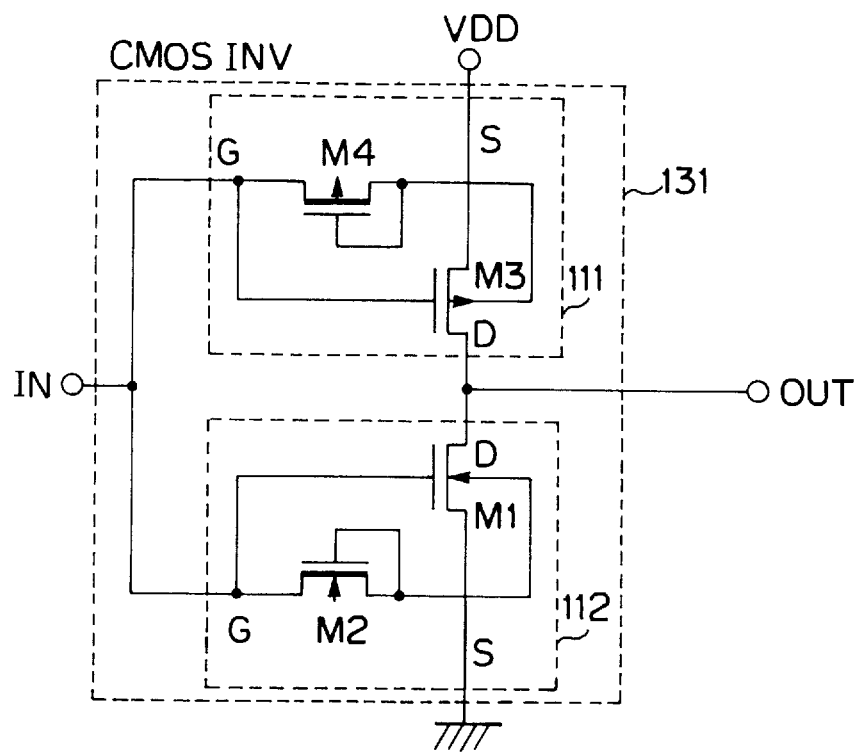
FIG. 17 is a circuit diagram showing a CMOS inverter in accordance with a third embodiment of the present invention.
Figure 18A:
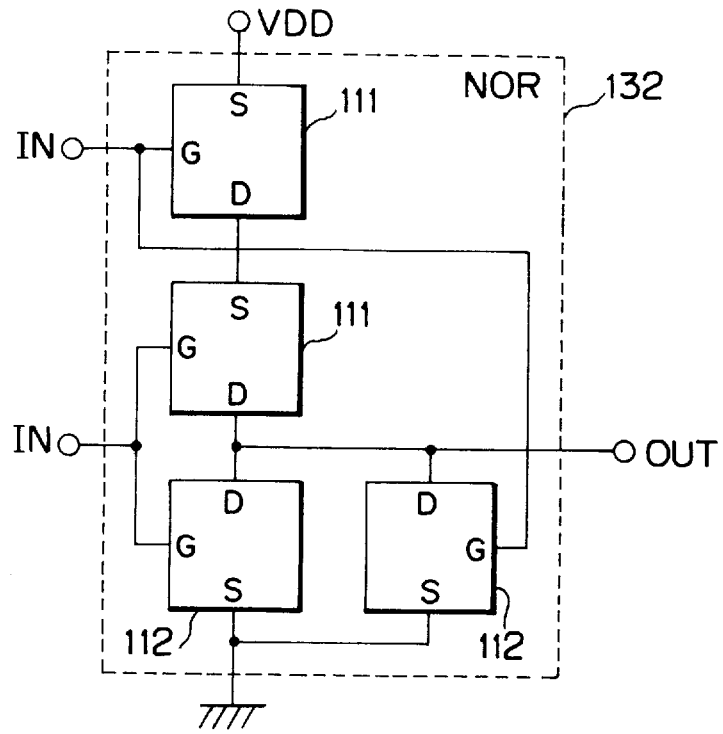
Figure 18B:
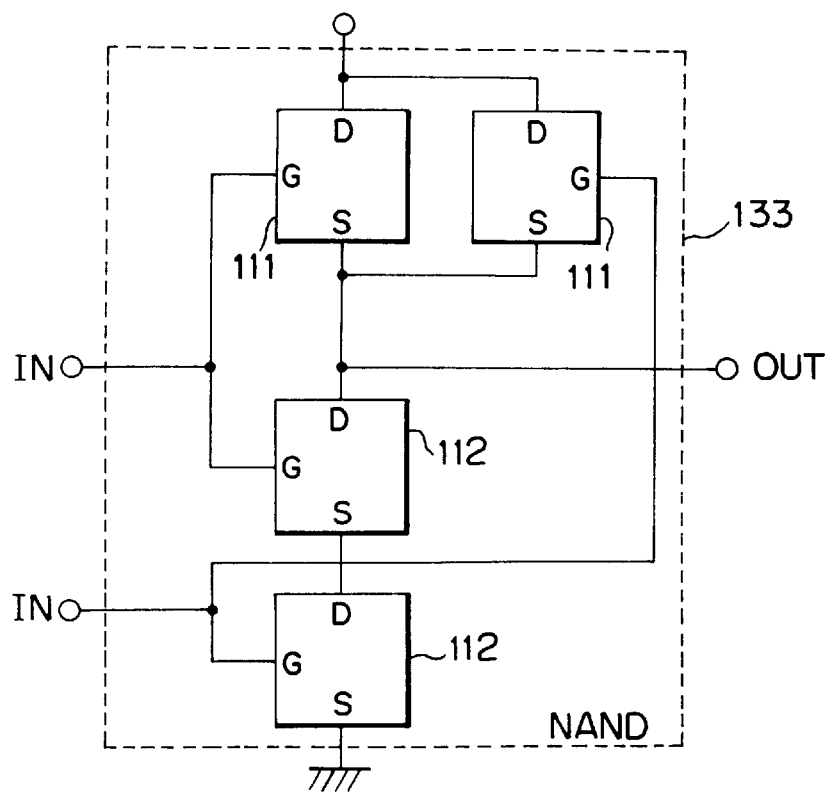

FIGS. 17, 18A and 18B show CMOS logic circuits in accordance with a third embodiment of the present invention, which are configured using only the MOSFET circuits 111 and 112 as shown in FIGS. 6A and 6B. FIG. 17 shows a CMOS inverter 131 including the n-channel MOSFET circuit 112 functioning as the driver transistor, and the p-channel MOSFET circuit 111 functioning as the load transistor. FIG. 18A shows a 2-input NOR circuit 132 including two p-channel MOSFET circuits 111 connected in series to form the load transistor, and two n-channel MOSFET circuits 112 connected in parallel to form the driver transistors. FIG. 18B shows a 2-input NAND circuit 133 including two p-channel MOSFET circuits 111 connected in parallel to form the load transistors, and two n-channel MOSFET circuits 112 connected in series to form the driver transistor. In these 2-input NOR circuit 132 and NAND circuit 133, the p-channel MOSFET circuit 111 replaces each of the MOSFETs M7 and M8 of the NOR circuit 123, and the MOSFETs M9 and M10 of the NAND circuit 124 in FIGS. 16A and 16B.

The third embodiment can also realize, as the second embodiment, the variable threshold voltage even for the supply voltage VDD>0.8V by applying the variable bias of the MOSFETs, thereby achieving the lower power consumption in a higher supply voltage region.

The configurations of FIGS. 15A–18B are characterized in that they can achieve a high speed, low power consumption CMOS logic circuit in a wide power supply voltage.

EMBODIMENT 4

Figure 19A:
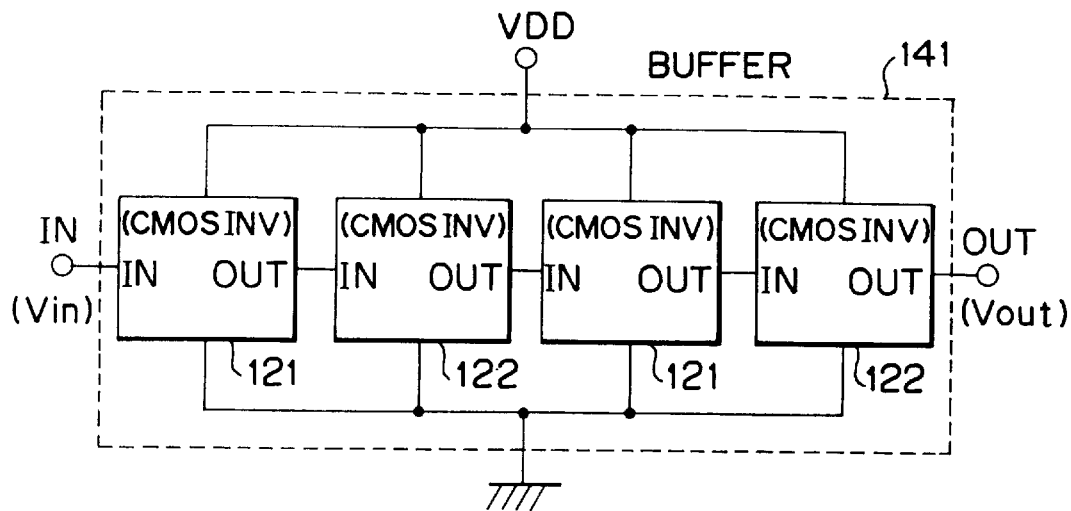
FIGS. 19A and 19B are block diagrams showing buffer circuits in accordance with a fourth embodiment of the present invention.
Figure 19B:
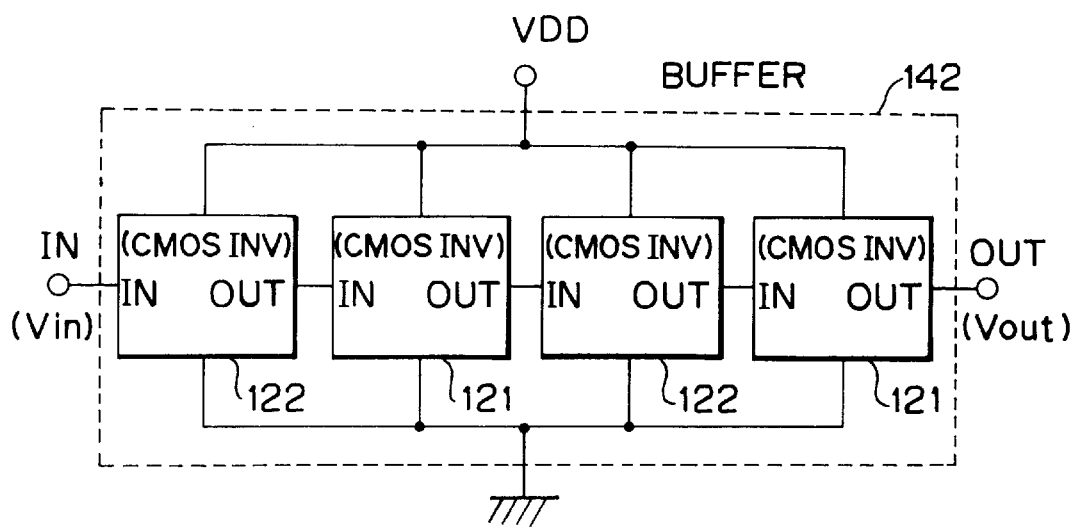

FIGS. 19A and 19B show CMOS logic circuits in accordance with a fourth embodiment of the present invention, in which the CMOS inverter circuit 122 as shown in FIG. 15A and the CMOS inverter circuit 121 as shown in FIG. 15B are alternately connected in cascade to form four stage buffer circuits 141 and 142. The buffer circuits 141 and 142 differ in that the final stage is the CMOS inverter 121 or 122.

In the foregoing inverter 122 of FIG. 15A, the low threshold voltage MOSFET M5 is off when the input voltage Vin is "H" level, and the output voltage Vout is "L" level. In contrast, in the inverter 121 of FIG. 15B, the low threshold voltage MOSFET M6 is off when the input voltage Vin is "L" level, and the output voltage Vout is "H" level. The leakage current of the low threshold voltage MOSFETs M5 and M6 is large when they are off because of their insufficient resistance.

On the other hand, in the inverter 122 of FIG. 15A, the n-channel MOSFET circuit 112 is off when the input voltage Vin is "L" level, and the output voltage Vout is "H" level. In contrast, in the inverter 121 of FIG. 15B, the p-channel MOSFET circuit 111 is off when the input voltage Vin is "H" level, and the output voltage Vout is "L" level. The leakage current of these circuit 112 and 111 is small when they are off because of their sufficiently large resistance.

Thus, when the input and output terminals are placed at "H" level, the buffer circuit 141 of FIG. 19A has a small leakage current because the entire gate circuits have small leakage currents. In other words, the static current of the buffer circuit 141 is small when the input voltage is "H", but is large when the input voltage is "L". In contrast, the buffer circuit 142 of FIG. 19B has a small leakage current when the input and output terminals are placed at "L" level because the entire gate circuits have small leakage currents. In other words, the static current of the buffer circuit 142 is small when the input voltage is "L", but is large when the input voltage is "H".

This means that the current in a sleep mode due to the leakage current of the devices can be reduce in the buffer circuits 141 and 142 at one of the binary logic values. There are many variations of this simple example. For example, a buffer circuits including four or more even stages of the circuits 121 and 122 alternately connected in cascade, or an inverter of odd stages connected in a similar manner.

EMBODIMENT 5

Figure 20:
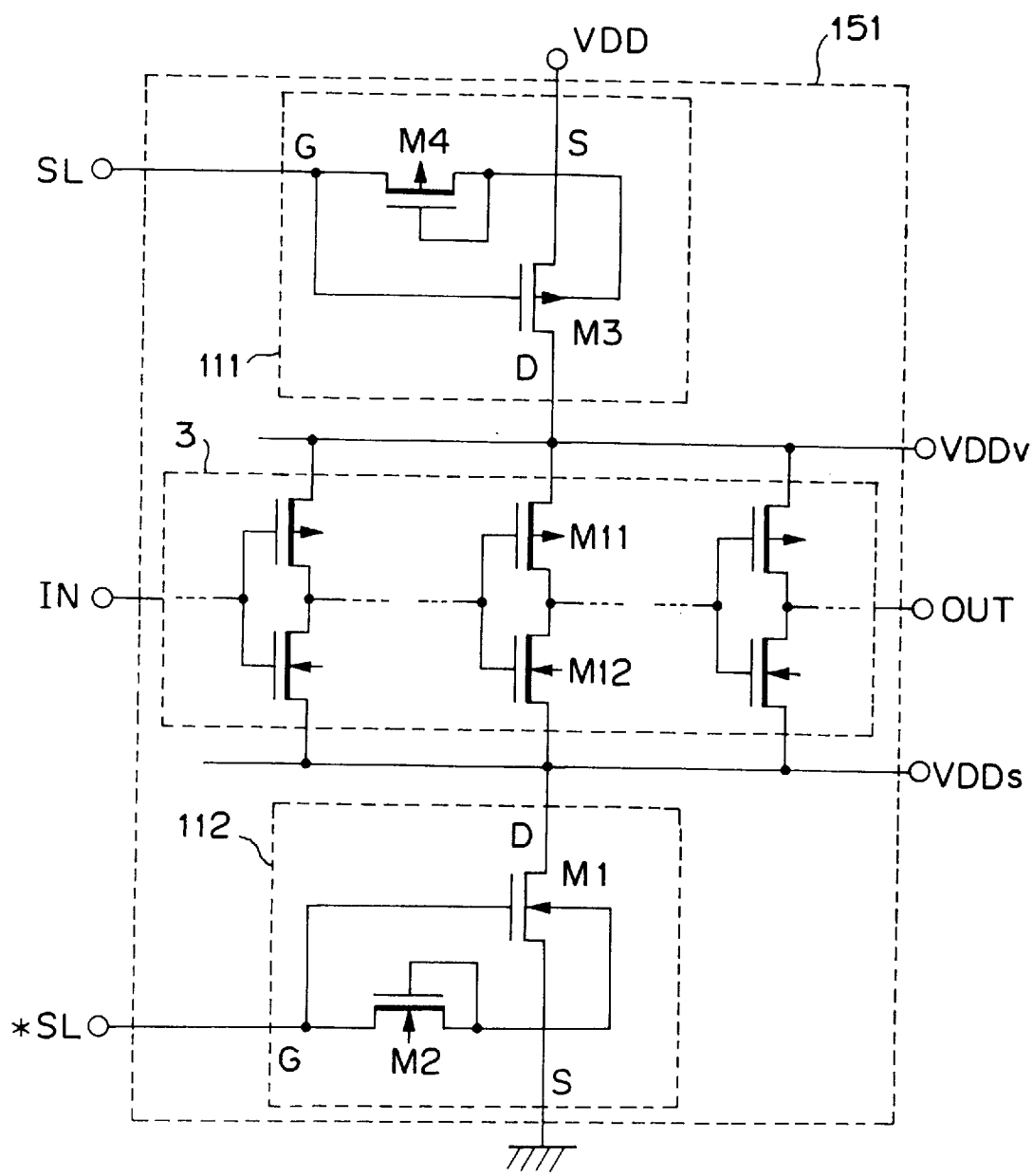
FIG. 20 is a circuit diagram showing a CMOS logic circuit in accordance with a fifth embodiment of the present invention.
Figure 21A:
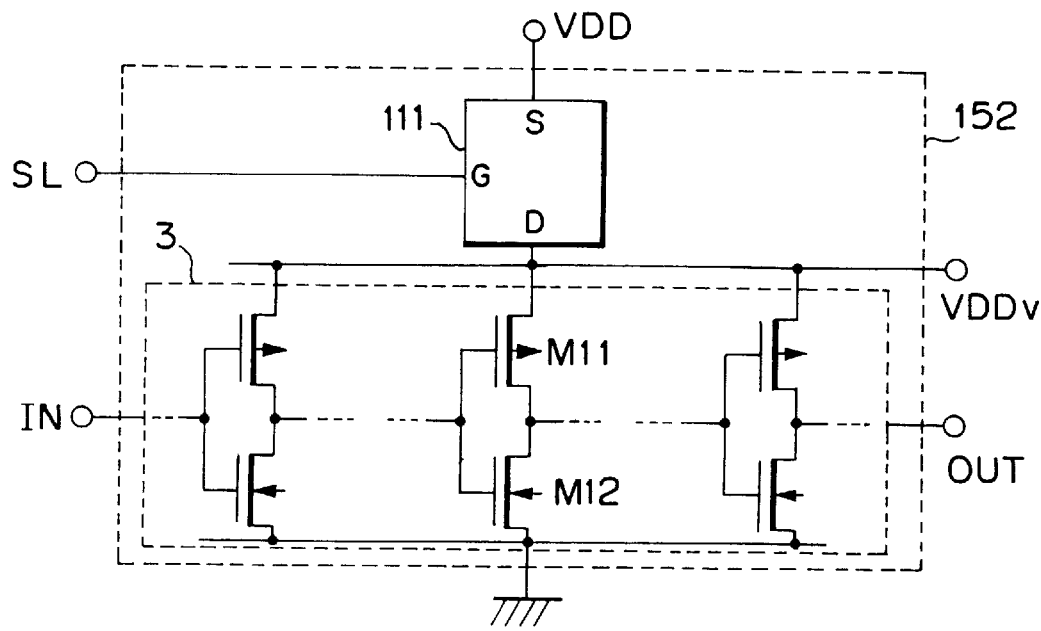
FIGS. 21A and 21B are circuit diagrams showing variations of the fifth embodiment.
Figure 21B:
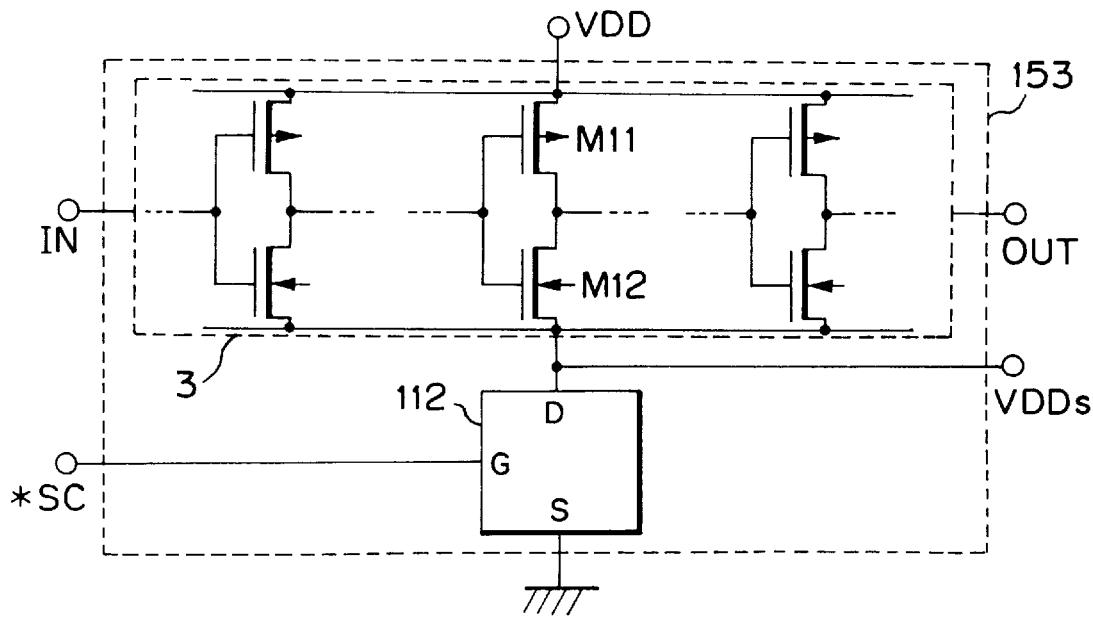

FIGS. 20, 21A and 21B are circuit diagrams showing a fifth embodiment in accordance with the present invention. First, FIG. 20 shows a CMOS logic circuit 151 in which the p-channel MOSFET 111 circuit shown in FIG. 6B replaces the high-potential power supply controller 4 in the CMOS logic circuit described with reference to FIG. 2, and the n-channel MOSFET circuit 112 shown in FIG. 6A replaces the low-potential power supply controller 5.

Figure 1:
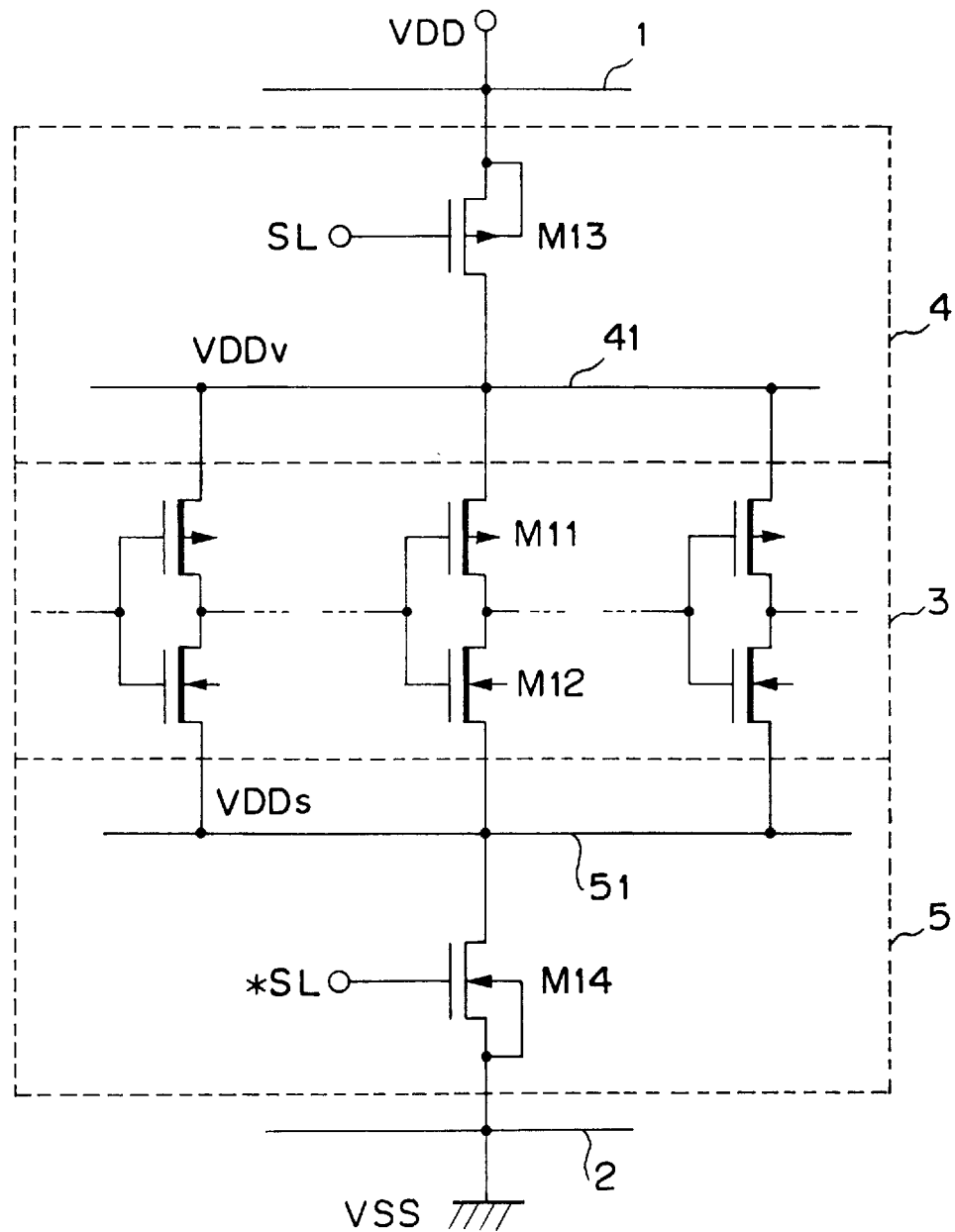
FIG. 1 is a circuit diagram showing a conventional CMOS logic circuit.
Figure 2:
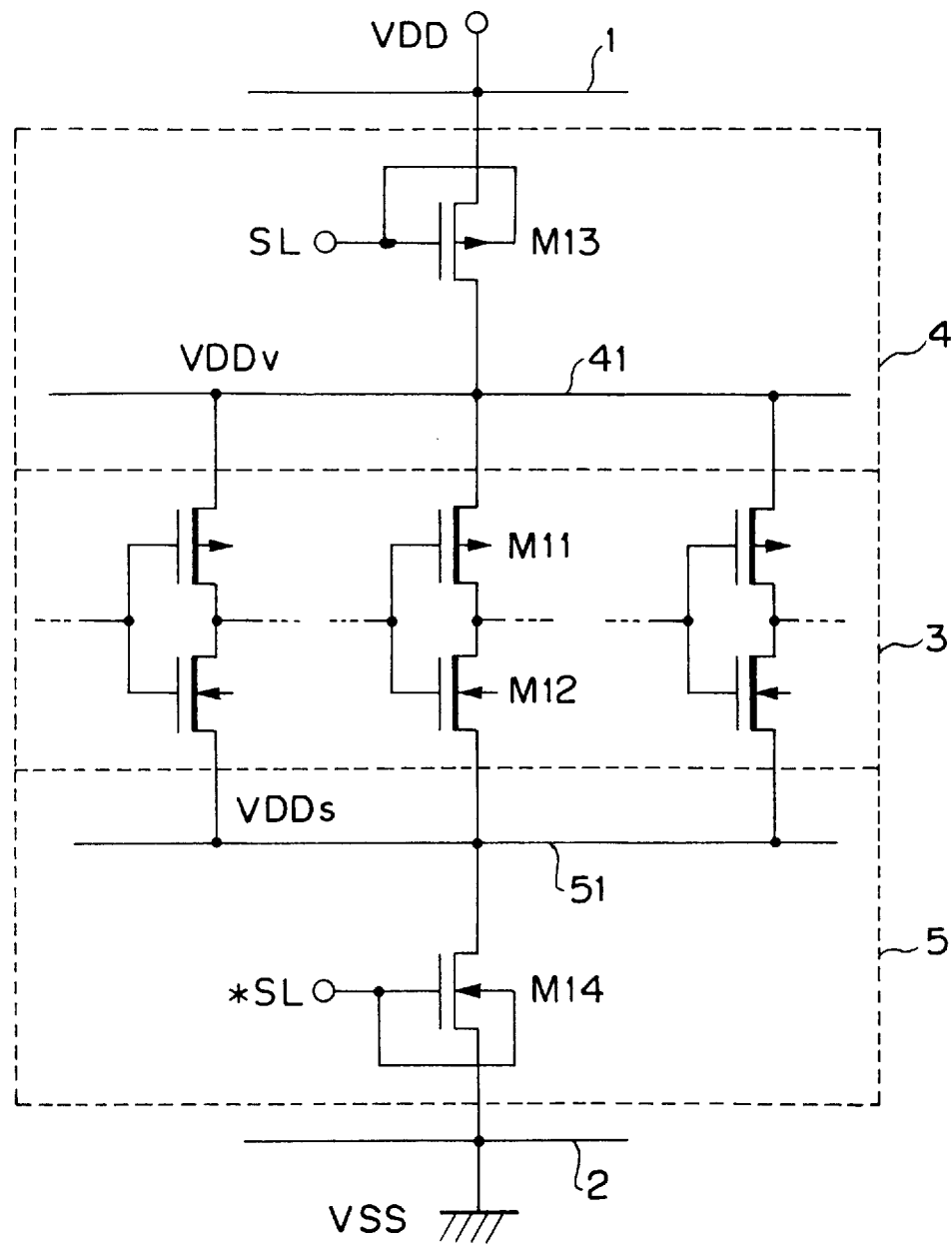
FIG. 2 is a circuit diagram showing another conventional CMOS logic circuit, an improved version of the CMOS logic circuit shown in FIG. 1.
Figure 3A:
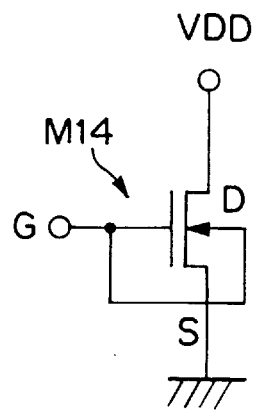
Figure 3B:
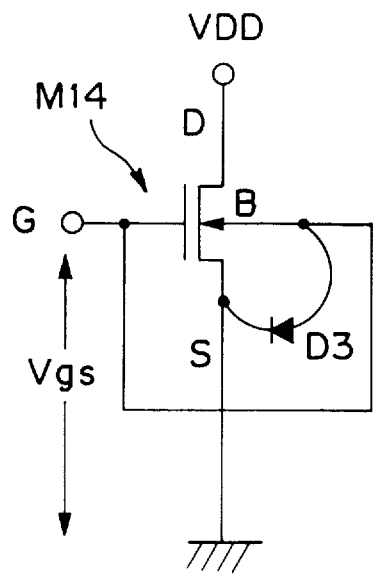
Figure 4:
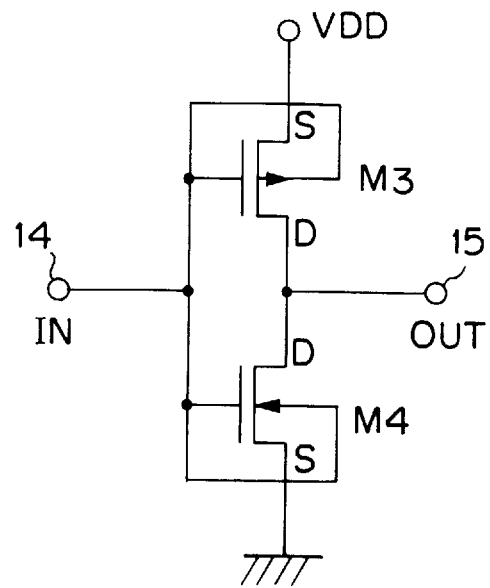
FIG. 4 is a circuit diagram of a conventional CMOS inverter.
Figure 5:
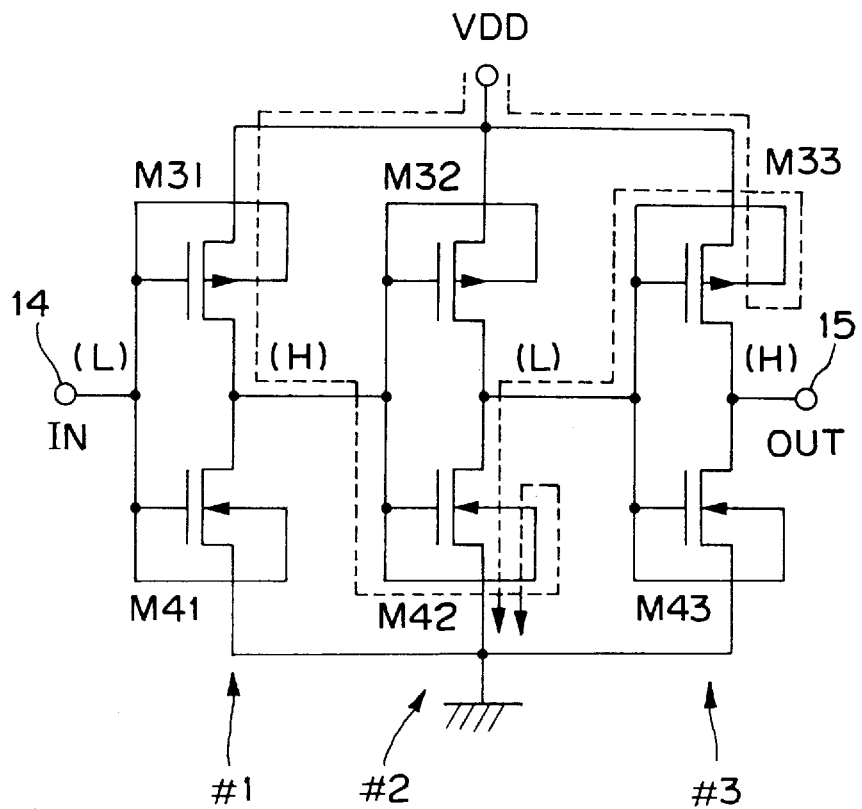
FIG. 5 is a circuit diagram showing a cascade configuration of three CMOS inverters shown in FIG. 4.

The operation of this CMOS logic circuit 151 is the same as that of the circuit of FIG. 2 up to the supply voltage VDD=0.8V (more precisely, up to the forward voltage Vf of the diode $D_3$). When the power supply voltage VDD exceeds 0.8V, the backgate voltage of the high threshold voltage MOSFETs M1 and M3 are clamped by the low threshold voltage MOSFETs M2 and M4 in the MOSFET circuits 112 and 111. Therefore, the increase in the gate current is prevented, and the threshold voltage during the operation is dropped, thereby achieving the low impedance of the MOSFETs M1 and M3, and implementing the high speed operation. Thus, the advantages of the circuit as shown in FIG. 2 are achieved to a wider supply voltage range.

Although the MOSFET circuits 112 and 111 of FIGS. 6A and 6B are used at both high-potential power supply controller and low-potential power supply controller in the CMOS logic circuit 151 in FIG. 20, this is not essential. For example, a CMOS logic circuit 152 as shown in FIG. 21A can be implemented in which only the p-channel MOSFET circuit 111 is connected to the high-potential side, or a CMOS logic circuit 153 as shown in FIG. 21B can be implemented in which only the n-channel MOSFET circuit 112 is connected to the low-potential side. In these cases, the power supply terminal to which the power supply controller is not connected is directly connected to the power supply VDD or to the ground. These configurations can achieve nearly similar effect and advantages.

EMBODIMENT 6

Figure 22A:
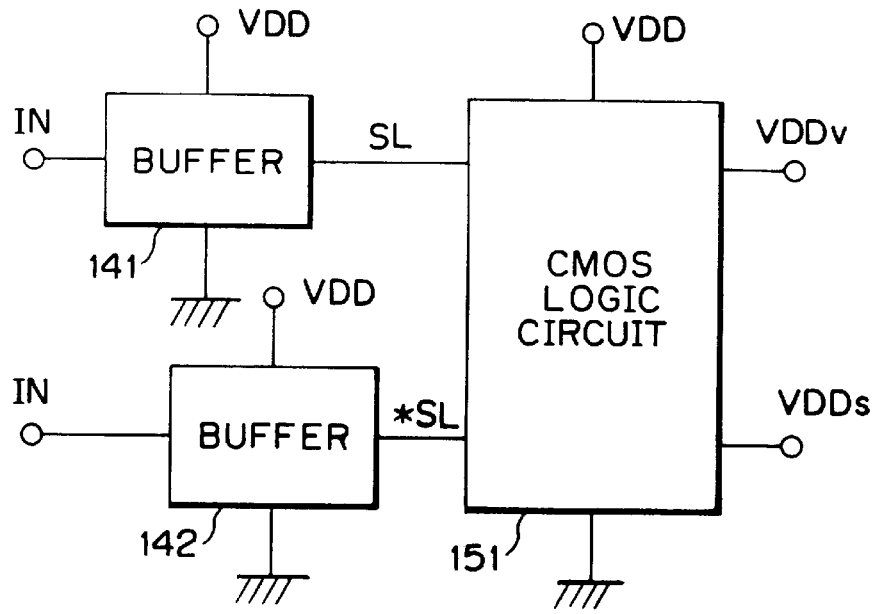
FIGS. 22A–22C are block diagrams showing CMOS logic circuits in accordance with a sixth embodiment of the present invention.
Figure 22B:
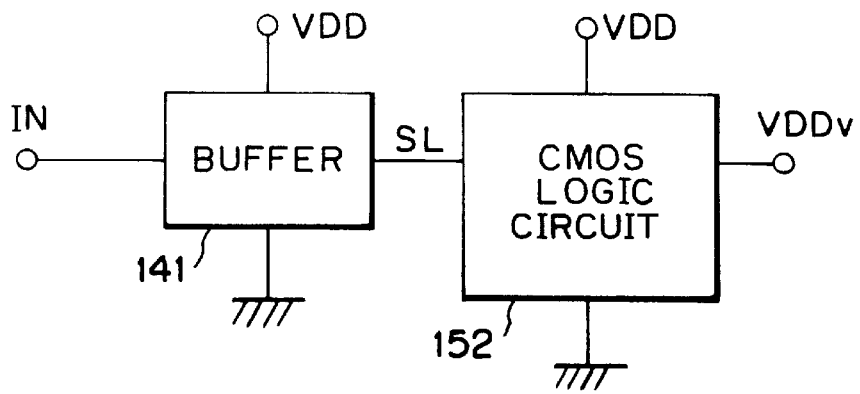
Figure 22C:
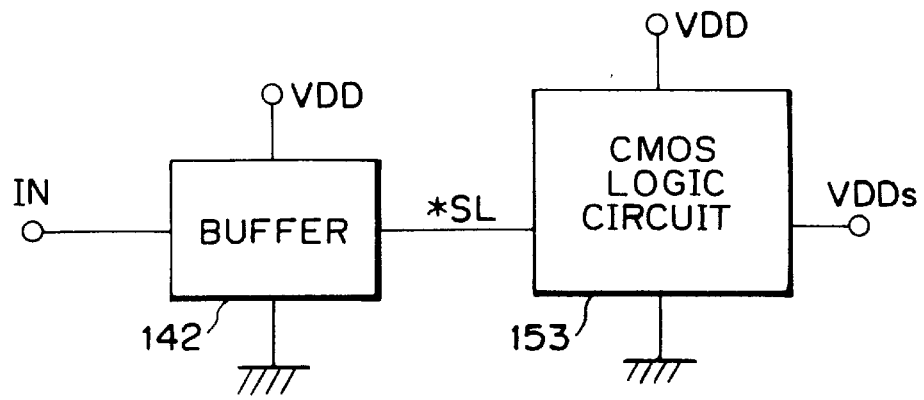

FIGS. 22A–22C are circuit diagrams showing a sixth embodiment in accordance with the present invention. FIG. 22A shows a configuration in which the buffer circuits 141 and 142 as shown in FIGS. 19A and 19B are connected to the input terminals of the signals SL and *SL of the CMOS logic circuit 151 shown in FIG. 20, respectively. FIG. 22B shows a configuration in which the buffer circuits 141 as shown in FIG. 19A is connected to the input terminal of the signal SL of the CMOS logic circuit 152 shown in FIG. 21A, and FIG. 22C shows a configuration in which the buffer circuits 142 as shown in FIG. 19B is connected to the input terminal of the signal *SL of the CMOS logic circuit 153 shown in FIG. 21B.

In the circuits as shown in FIGS. 22A–22C, the rest current of the buffer circuits 141 and 142 decreases when the signal SL is "H" and the signal *SL is "L", that is, when the low threshold voltage CMOS logic circuit group 3 is in a waiting (sleeping) mode.

Thus, since the rest current is very small when the low threshold voltage CMOS logic circuit group 3 is in the waiting mode, this circuit is effective to reduce the power consumption. In particular, when a ratio of the waiting mode to the active mode is large, effective power reduction can be implemented. As a result, the circuits as shown in FIG. 22A–22C have an advantage that they can achieve the high speed operation in the active mode and the low power consumption in the waiting mode at the same time in a wide supply voltage range from less than 1V up to 3 to 5V.

In summary, the arrangements as shown in FIGS. 20–22C can implement a high speed, low power consumption multi-threshold CMOS logic circuit in a wide supply voltage. In particular, the configurations in FIGS. 22A–22C has a very low leakage current, and hence very low power consumption in the waiting mode, and is effective when the waiting mode is longer than the active mode.

It is possible to arrange the circuits in FIGS. 20, 21A, 21B, 22A–22C with SOI MOSFETs, and to make floating the bodies of the many low threshold voltage MOSFETs constituting the CMOS logic circuit 3. This obviates the backgate terminals. In the SOI MOSFETs, each of the backgate terminals must be drawn from each one of the MOSFETs. In addition, the backgate terminals require a certain amount of areas as shown in FIGS. 9A and 9B. As a result, the area occupied by the entire backgate terminals in a chip is rather substantial. Accordingly, obviating the background terminals will greatly reduce the chip area, thereby implementing a high density integration. In the n-channel (p-channel) MOSFETs, in which the body is floated, the potential of the body will increase (decrease) owing to the inflow of holes (electrons) from the drain to the body. Thus, the threshold voltage drops, and the MOSFETs in the CMOS logic circuit can operate at a low voltage.

EMBODIMENT 7

Figures 23, 24:
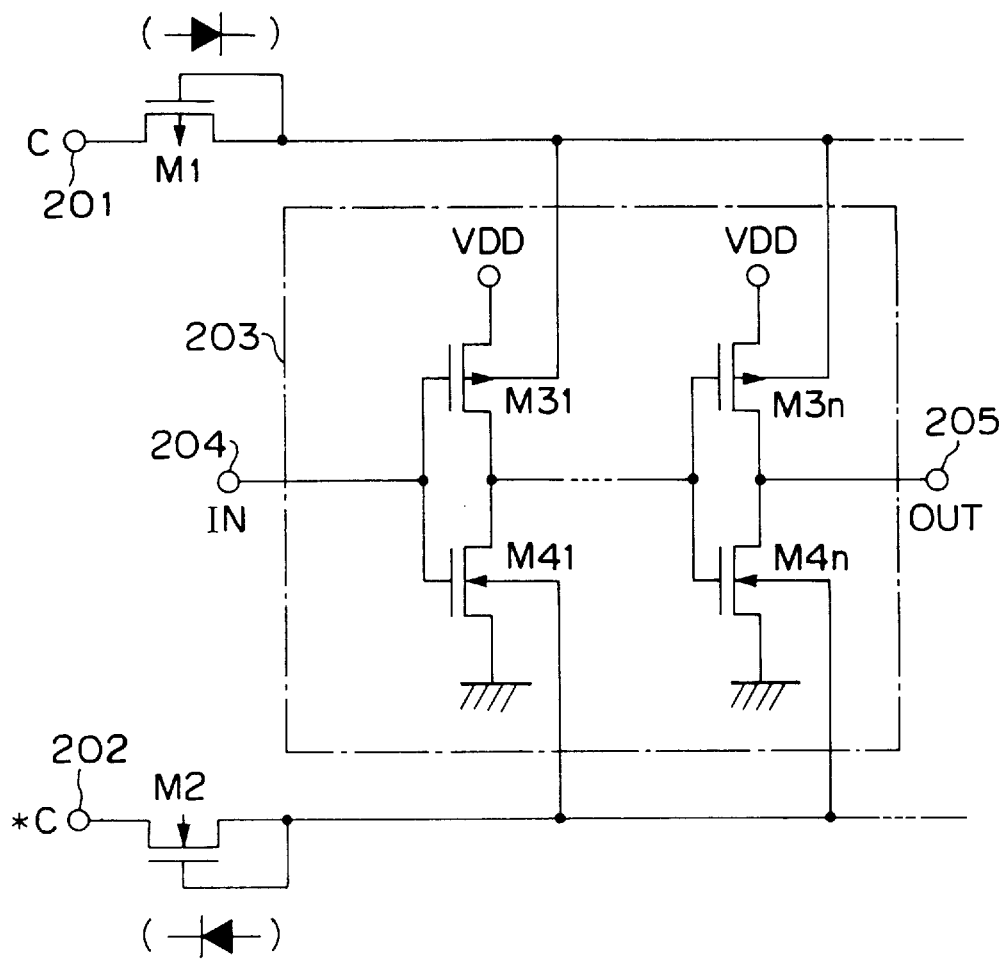
FIG. 23 is a circuit diagram showing a CMOS logic circuit in accordance with a seventh embodiment of the present invention.
FIG. 24 is a table illustrating operation modes of the CMOS logic circuit of the seventh embodiment.

FIG. 23 is a circuit diagram showing a MOSFET circuit of a seventh embodiment in accordance with the present invention. In this figure, the reference numeral 201 designates a first control terminal to which a control signal C is input, 202 denotes a second control terminal to which a control signal *C complementary to the control signal C is input, 203 designates an internal CMOS circuit including n-cascaded CMOS inverters, 204 denotes a signal input terminal, and 205 denotes a signal output terminal.

In this circuit, all the backgate terminals of p-channel MOSFETs M31–M3n constituting the load MOSFETs of the internal CMOS circuit 203 are connected to the first control terminal 201 through a p-channel MOSFET M1 (a first rectifier element) whose gate and source are interconnected. Likewise, all the backgate terminals of n-channel MOSFETs M41–M4n constituting the driver MOSFETs of the internal CMOS circuit 203 are connected to the second control terminal 202 through an n-channel MOSFET M2 (a second rectifier element) whose gate and source are interconnected.

The p-channel MOSFET M1 with its gate and source interconnected conducts a forward current from the drain to the gate and source, thereby functioning as a diode whose anode is the drain, and cathode is the gate and source. The forward voltage Vf of the diode is the threshold voltage of the MOSFET M1.

The n-channel MOSFET M2 with its gate and source interconnected conducts a forward current from the gate and source to the drain, thereby functioning as a diode whose anode is the gate and source, and cathode is the drain. The forward voltage Vf of the diode is the threshold voltage of the MOSFET M2.

Next, the operation of the seventh embodiment will be described. First, when the control signal C applied to the first control terminal 201 is low, the p-channel MOSFET M1 functioning as a rectifier element is reversely biased, and operates as one of the reference diodes due to its leakage current. This will drop the backgate voltage of the MOSFETs M31–M3n, thereby reducing their threshold voltage.

In this case, since the control signal *C applied to the second control terminal 202 is high, the n-channel MOSFET M2 functioning as a rectifier element is also reversely biased, and operates as one of the reference diodes due to its leakage current. This will increase the backgate voltage of the MOSFETs M41–M4n, thereby reducing their threshold voltage.

The drop of the threshold voltages makes it possible for MOSFETs to operated at a high speed even with a low supply voltage near the original threshold voltage of the MOSFETs.

Furthermore, although a short-circuit is formed between the backgate terminal and the source terminal due to forward bias in each MOSFET, the reverse-biased MOSFETs M1 and M2, through which only the leakage current flows, can prevent short-circuit current from flowing. This effect is particularly distinct when the supply voltage exceeds the forward voltage Vf (0.8V) of the diode D3, in comparison with the conventional circuit.

Moreover, the small leakage current flowing through the rectifier MOSFETs M1 and M2 can prevent a great decrease in the backgate potential of the p-channel MOSFETs M31–M3n, and a great increase in the backgate potential of the n-channel MOSFETs M41–M4n.

Next, when the control signal C applied to the first control terminal 201 is high, and the control signal *C applied to the second control terminal 202 is low, the rectifier MOSFETs M1 and M2 are forwardly biased. This will set the backgate terminals of the p-channel MOSFETs M31–M3n at a high potential, and the backgate terminals of the n-channel MOSFETs M41–M4n at a low potential. In this case, the source terminal and backgate terminal of each of the MOSFETs M31–M3n and M41–M4n are kept equipotential, thereby causing no drop in the threshold voltage or short-circuit current.

Thus, as shown in FIG. 24, the circuit is in an active mode when the control signal C is low, and the control signal *C is high, because the threshold voltage of the MOSFETs is changed low in this case. Accordingly, it is possible for the circuit to use a low supply voltage, and to achieve a high speed operation in the active mode. Reversely, the circuit is in a sleep mode when the control signal C is high, and the control signal *C is low, in which case the threshold voltage of the MOSFETs is kept at the original high threshold voltage. Accordingly, it is possible for the circuit to reduce the power consumption in the sleep mode because the leakage current flowing through the source and drain of each of the MOSFETs is kept very low in this mode.

Although the rectifier p-channel MOSFET M1 is common to all the p-channel MOSFETs M31–M3n, and the rectifier n-channel MOSFET M2 is common to all the n-channel MOSFETs M41–M4n in the internal CMOS circuit 203 in FIG. 23, this is not essential. For example, the rectifier MOSFET can be connected to each one of the MOSFETs, or to each set of plurality of MOSFETs in the internal CMOS circuit 203.

In addition, although the rectifier MOSFETs are connected to the backgate terminals of both the p-channel MOSFETs M31–M3n and n-channel MOSFETs M41 and M4n in the internal CMOS circuit 203, this is not necessary. For example, the rectifier MOSFET can be connected to the backgate terminals of either the p- or n-channel MOSFETs, and a fixed voltage can be connected to the backgate terminals of the remaining MOSFETs. In this case, if the fixed voltage is supplied to the backgate terminals of the p-channel MOSFETs, they are grounded, whereas if the fixed voltage is supplied to the backgate terminals of the n-channel, they are provided with the power supply voltage. Alternatively, the backgate terminals of the remaining MOSFETs can be made floating. In this case, the complementary control signal *C is not needed.

In addition, although the internal CMOS circuit 203 consists of the CMOS inverters connected in cascade in FIG. 23, it can include CMOS circuits other than CMOS inverters.

EMBODIMENT 8

Figure 25:
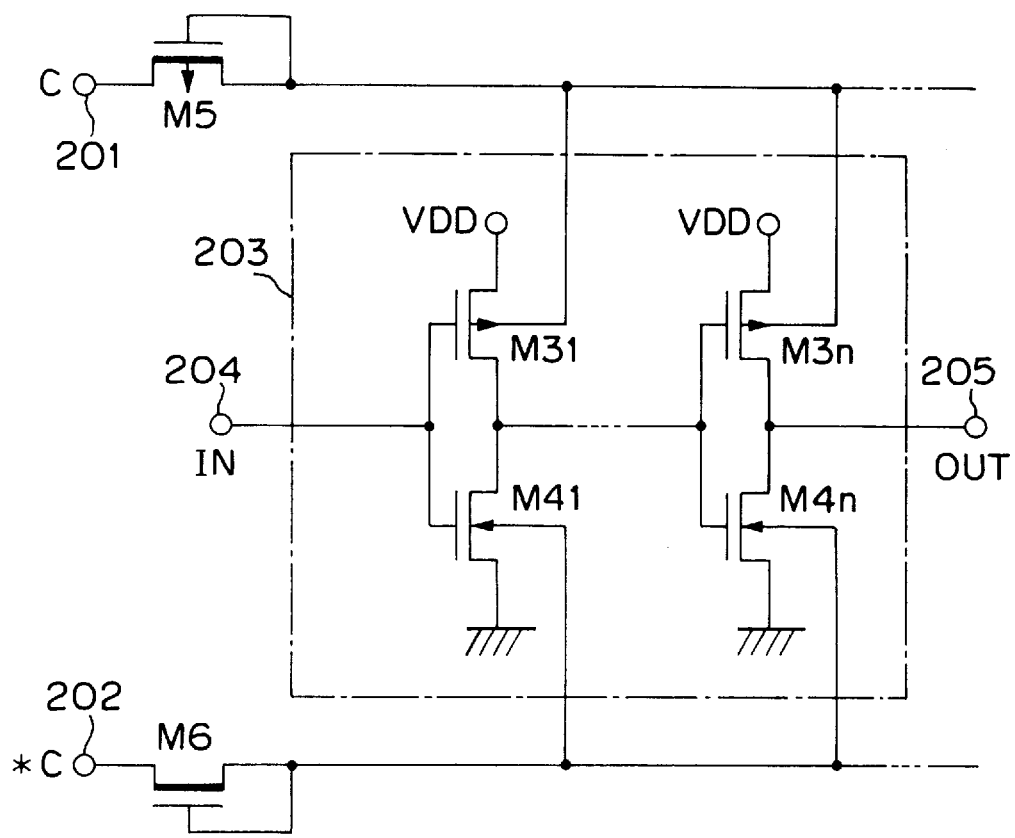
FIG. 25 is a circuit diagram showing a CMOS logic circuit in accordance with an eighth embodiment of the present invention.

FIG. 25 is a circuit diagram of a MOSFET circuit of an eighth embodiment in accordance with the present invention. In this embodiment, a p-channel MOSFET M5 and an n-channel MOSFET M6 are used as a rectifier transistor with its gate and source connected in common. Each of these MOSFETs is a low threshold voltage MOSFET with a threshold voltage lower than that of the MOSFETs M31–M3n and M41–M4n constituting the internal CMOS circuit 203. For example, when the MOSFETs M31–M3n and M41–M4n have a threshold voltage of 0.6V, the rectifier MOSFETs M5 and M6 have a threshold voltage of 0.2V.

Using such a low threshold voltage MOSFETs as the rectifier MOSFETs M5 and M6 has an advantage that a desired leakage current can be achieved with a small area. This is because a low threshold voltage MOSFET has a large leakage current.

EMBODIMENT 9

Figure 26:
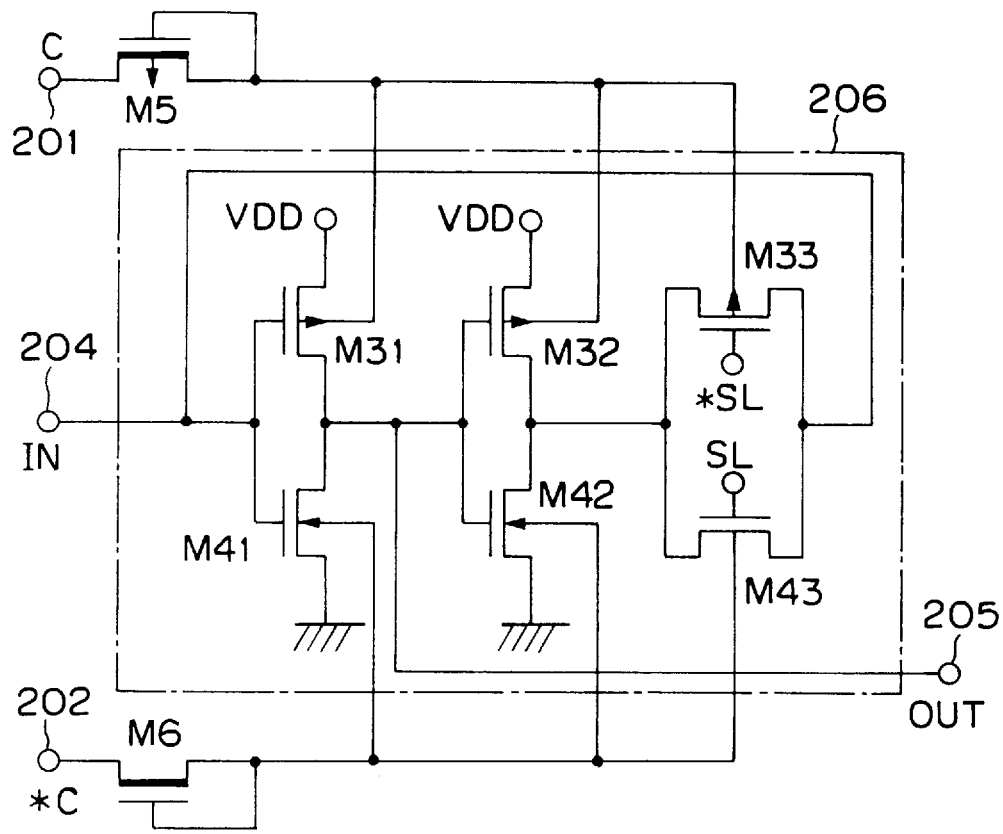
FIG. 26 is a circuit diagram showing a CMOS logic circuit in accordance with a ninth embodiment of the present invention.

FIG. 26 is circuit diagram showing a MOSFET circuit of a ninth embodiment in accordance with the present invention. The internal circuit 203 of this circuit is a latch circuit 206 including two cascaded inverters and a transmission gate connected in a loop. The two inverters are each arranged by combining a p-channel MOSFET M31 with an n-channel MOSFET M41, and M32 with M42, and the transmission gate is composed of a p-channel MOSFET M33 and an n-channel MOSFET M43. The backgate terminals of the p-channel MOSFETs M31–M33 of the latch circuit 206 is connected to a first control terminal 201 through a rectifier MOSFET M5, and the backgate terminals of the n-channel MOSFETs M41 and M43 are connected to a second control terminal 202 through a rectifier MOSFET M6.

In the MOSFET circuit as shown in FIG. 26, the threshold voltages change of the p-channel MOSFET M33 and the n-channel MOSFET M43 constituting the transmission gate: The threshold voltages are lower when they are in a conductive state than in a non-conductive state. This reduces the ON state resistance of the transmission gate, thereby ensuring its memory operation with a low supply voltage just above the threshold voltage of the non-conductive MOSFETs M33 and M43.

EMBODIMENT 10

Figure 27:
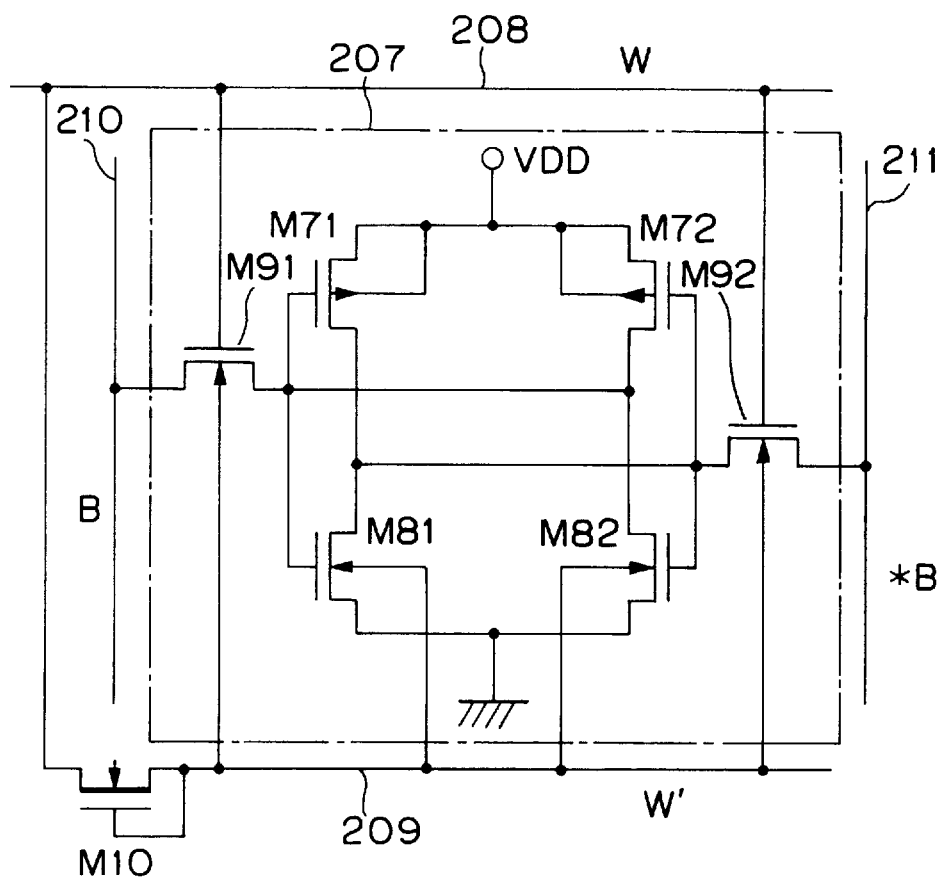
FIG. 27 is a circuit diagram showing a CMOS logic circuit in accordance with a tenth embodiment of the present invention.

FIG. 27 is a circuit diagram of a MOSFET circuit of a tenth embodiment in accordance with the present invention. In this embodiment, the internal CMOS circuit 203 is a memory cell 207 composed of p-channel MOSFETs M71 and M72, n-channel MOSFETs M81 and M82, and n-channel MOSFETs M91 and M92 constituting transmission gates. The backgate terminals of the n-channel MOSFETs M81, M82, M91 and M92 are connected to a control word line 209 which is connected to a word line 208 through a rectifier n-channel MOSFET M10. The reference numeral 210 designates a bit line, and 211 denotes an inverted bit line.

With such an arrangement, the threshold voltage will drop of the n-channel MOSFETs of the memory cell 207 selected by the word line 208, thereby reducing an equivalent resistance of these MOSFETs. This enables the memory cell 207 to read and write positively even with a low supply voltage at which the ON state resistance of the MOSFETs increases.

Although the transmission gates of the memory cell 207 employ the n-channel MOSFETs M91 and M92 in the configuration of FIG. 27, it can use p-channel MOSFETs with their backgate terminals connected to the word line 208 through a rectifier MOSFET. Furthermore, complementary control words can also be adopted, in which case the circuit becomes similar to those of FIGS. 23 and 25.

Figure 28:
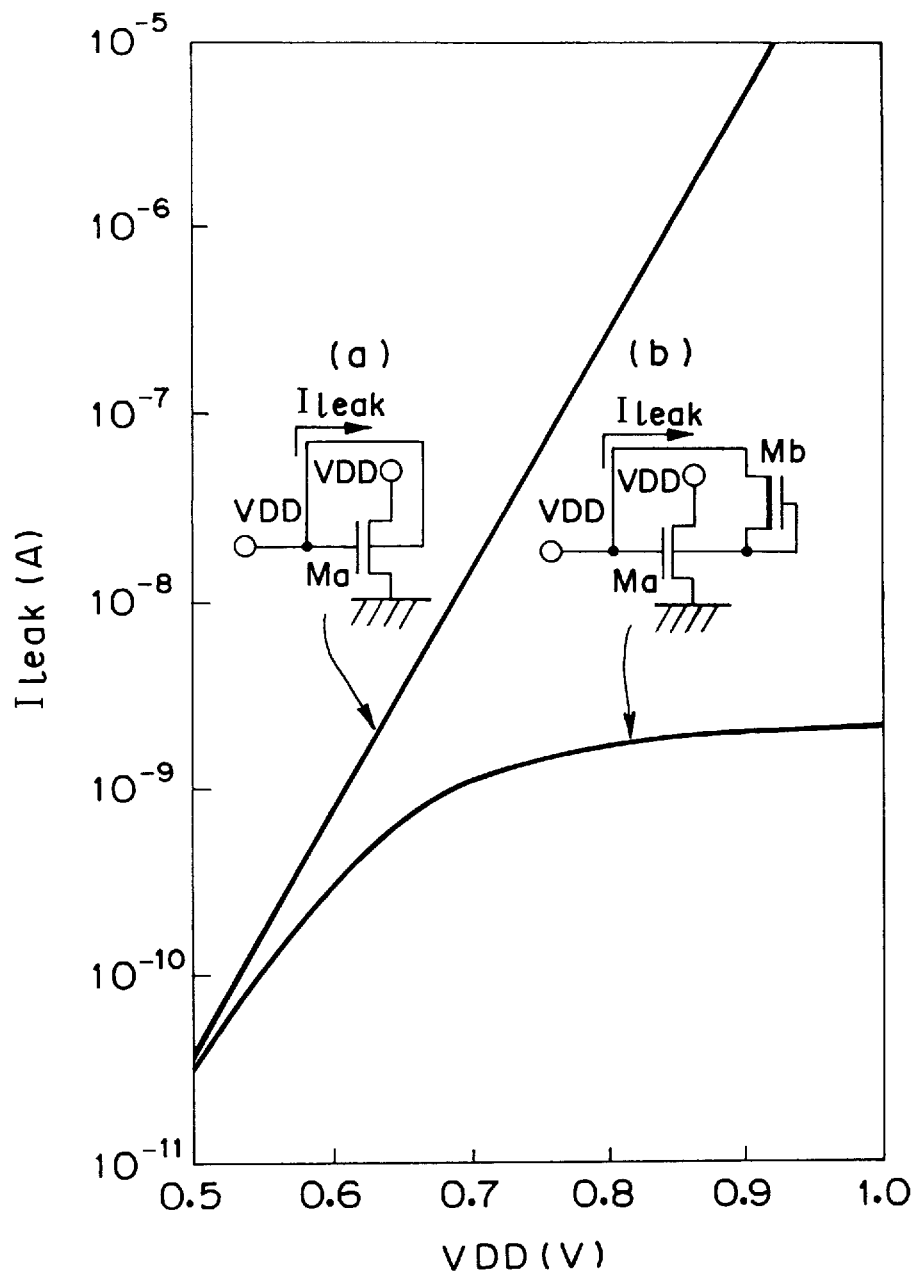
FIG. 28 is a graph illustrating the reduction effect of a leakage current in the tenth embodiment.

FIG. 28 is a graph illustrating a reduction effect of the leakage current $I_{leak}$ flowing through the backgate terminal and the source terminal of a MOSFET when they are forwardly biased. As is clear from this figure, the leakage current $I_{leak}$ is greatly reduced in the MOSFET in accordance with the present invention.

The foregoing circuits are effectively formed on a SOI substrate as described above. This is because each MOSFET formed on the SOI substrate has an independent backgate region, and hence the potential of the backgate terminal can be set rather arbitrary.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A MOSFET circuit comprising:
   a first MOSFET having a first threshold voltage; and
   a second MOSFET having a second threshold voltage lower than or equal to said first threshold voltage, said second MOSFET having a gate electrode and a first main current electrode connected to a backgate electrode of said first MOSFET, and a second main current electrode connected to an external signal, wherein said second threshold voltage is lower than said first threshold.

2. A CMOS logic circuit including a series connection of a load transistor and a driver transistor, one of said driver transistor and said load transistor including a first MOSFET circuit, said first MOSFET circuit comprising:
   a first MOSFET having a first threshold voltage, and being connected to the other of said driver transistor and said load transistor; and
   a second MOSFET having a second threshold voltage lower than said first threshold voltage, and having a gate electrode and a first main current electrode connected to a backgate electrode of said first MOSFET, and a second main current electrode connected to a gate electrode of said first MOSFET.

3. The CMOS logic circuit as claimed in claim 2, wherein the other of said driver transistor and said load transistor is a MOSFET, and said CMOS logic circuit is a CMOS inverter.

4. The CMOS logic circuit as claimed in claim 2, wherein said load transistor comprises M (M is an integer greater than one) MOSFETs connected in series, and said driver transistor comprises M said first MOSFET circuits connected in parallel, and said CMOS logic circuit is a NOR circuit.

5. The CMOS logic circuit as claimed in claim 2, wherein said load transistor comprises M (M is an integer greater than one) MOSFETs connected in parallel, and said driver transistor comprises M said first MOSFET circuits connected in series, and said CMOS logic circuit is a NAND circuit.

6. The CMOS logic circuit as claimed in claim 2, wherein the other of said driver transistor and said load transistor includes a second MOSFET circuit, said second MOSFET comprising:
 a third MOSFET having a third threshold voltage, and being connected with said first MOSFET circuit in series; and
 a fourth MOSFET having a fourth threshold voltage lower than said third threshold voltage, and having a gate electrode and a first main current electrode connected to a backgate electrode of said third MOSFET, and a second main current electrode connected to a gate electrode of said third MOSFET.

7. The CMOS logic circuit as claimed in claim 6, wherein said CMOS logic circuit is a CMOS inverter.

8. The CMOS logic circuit as claimed in claim 6, wherein said driver transistor comprises M (M is an integer greater than one) said first MOSFET circuits connected in parallel, and said load transistor comprises M said second MOSFET circuits connected in series, and said CMOS logic circuit is a NOR circuit.

9. The CMOS logic circuit as claimed in claim 6, wherein said driver transistor comprises M (M is an integer greater than one) said first MOSFET circuits connected in series, and said load transistor comprises M said second MOSFET circuits connected in parallel, and said CMOS logic circuit is a NAND circuit.

10. The CMOS logic circuit as claimed in claim 2, wherein each MOSFET of said CMOS logic circuit is a SOIFET which is formed on a SOI (Semiconductor On Insulator) substrate.

11. The CMOS logic circuit as claimed in claim 10, wherein carrier concentration of a body of said second MOSFET is controlled such that said body becomes a fully depleted state.

12. The CMOS logic circuit as claimed in claim 10, wherein carrier concentration of a body of said second MOSFET is controlled such that said body becomes a partially depleted state.

13. A buffer circuit including a first CMOS inverter and a second CMOS inverter alternately connected in cascade,
 wherein a load transistor of said first CMOS inverter comprises:
  a first MOSFET having a first threshold voltage, and being connected with a driver transistor of said first CMOS inverter in series; and
  a second MOSFET having a second threshold voltage lower than said first threshold voltage, and having a gate electrode and a first main current electrode connected to a backgate electrode of said first MOSFET, and a second main current electrode connected to a gate electrode of said first MOSFET, and
 wherein a driver transistor of said second CMOS inverter comprises:

a third MOSFET having a third threshold voltage, and being connected with a load transistor of said second CMOS inverter in series; and
 a fourth MOSFET having a fourth threshold voltage lower than said third threshold voltage, and having a gate electrode and a first main current electrode connected to a backgate electrode of said third MOSFET, and a second main current electrode connected to a gate electrode of said third MOSFET.

14. A CMOS logic circuit including a low threshold CMOS logic circuit and at least one switching circuit, said low threshold CMOS logic circuit including MOSFETs with a threshold voltage lower than a first threshold voltage, and said switching circuit being connected between a power supply terminal of said low threshold CMOS logic circuit and a power supply, wherein said switching circuit comprises:
 a first MOSFET having said first threshold voltage, and being connected between said power supply and said power supply terminal of said low threshold CMOS logic circuit; and
 a second MOSFET having a second threshold voltage lower than said first threshold voltage, and having a gate electrode and a first main current electrode connected to a backgate electrode of said first MOSFET, and a second main current electrode connected to a gate electrode of said first MOSFET.

15. The CMOS logic circuit as claimed in claim 14, wherein said switching circuit is connected between a high potential terminal of said power supply and a high potential power supply terminal of said low threshold CMOS logic circuit.

16. The CMOS logic circuit as claimed in claim 14, wherein said switching circuit is connected between a low potential terminal of said power supply and a low potential power supply terminal of said low threshold CMOS logic circuit.

17. The CMOS logic circuit as claimed in claim 15, wherein said switching circuit is further connected between a low potential terminal of said power supply and a low potential power supply terminal of said low threshold CMOS logic circuit.

18. The CMOS logic circuit as claimed in claim 14, wherein said CMOS logic circuit is switched between a sleep mode and an active mode by a sleep signal externally fed, and further comprises a first buffer connected to a non-inverted sleep signal input terminal of said CMOS logic circuit, and a second buffer connected to an inverted sleep signal input terminal of said CMOS logic circuit,
 wherein said first buffer comprises a first CMOS inverter and a second CMOS inverter alternately connected in cascade, and a load transistor of said first CMOS inverter comprises:
  a first MOSFET having said first threshold voltage, and being connected with a driver transistor of said first CMOS inverter in series; and
  a second MOSFET having a second threshold voltage lower than said first threshold voltage, and having a gate electrode and a first main current electrode connected to a backgate electrode of said first MOSFET, and a second main current electrode connected to a gate electrode of said first MOSFET,
 wherein a driver transistor of said second CMOS inverter comprises:
  a third MOSFET having a third threshold voltage, and being connected with a load transistor of said second CMOS inverter in series; and
  a fourth MOSFET having a fourth threshold voltage lower than said third threshold voltage, and having a gate electrode and a first main current electrode connected to a backgate electrode of said third MOSFET, and a second main current electrode connected to a gate electrode of said third MOSFET, and wherein said second buffer comprises said second CMOS inverter and said first CMOS inverter alternately connected in cascade.

19. The CMOS logic circuit as claimed in claim 14, wherein said CMOS logic circuit is switched between a sleep mode and an active mode by a sleep signal externally fed, and further comprises a buffer connected to a non inverted sleep signal input terminal of said CMOS logic circuit, wherein said buffer comprises a first CMOS inverter and a second CMOS inverter alternately connected in cascade, and a load transistor of said first CMOS inverter comprises:
 a first MOSFET having said first threshold voltage, and being connected with a driver transistor of said first CMOS inverter in series; and
 a second MOSFET having a second threshold voltage lower than said first threshold voltage, and having a gate electrode and a first main current electrode connected to a backgate electrode of said first MOSFET, and a second main current electrode connected to a gate electrode of said first MOSFET, and wherein a driver transistor of said second CMOS inverter comprises:
 a third MOSFET having a third threshold voltage, and being connected with a load transistor of said second CMOS inverter in series; and
 a fourth MOSFET having a fourth threshold voltage lower than said third threshold voltage, and having a gate electrode and a first main current electrode connected to a backgate electrode of said third MOSFET, and a second main current electrode connected to a gate electrode of said third MOSFET.

20. The CMOS logic circuit as claimed in claim 14, wherein said CMOS logic circuit is switched between a sleep mode and an active mode by a sleep signal externally fed, and further comprises a buffer connected to an inverted sleep signal input terminal of said CMOS logic circuit, wherein said buffer comprises a first CMOS inverter and a second CMOS inverter alternately connected in cascade, wherein a driver transistor of said first CMOS inverter comprises:
 a first MOSFET having said first threshold voltage, and being connected with a load transistor of said first CMOS inverter in series; and
 a second MOSFET having a second threshold voltage lower than said first threshold voltage, and having a gate electrode and a first main current electrode connected to a backgate electrode of said first MOSFET, and a second main current electrode connected to a gate electrode of said first MOSFET, and wherein a load transistor of said second CMOS inverter comprises:
 a third MOSFET having a third threshold voltage, and being connected with a driver transistor of said second CMOS inverter in series; and
 a fourth MOSFET having a fourth threshold voltage lower than said third threshold voltage, and having a gate electrode and a first main current electrode connected to a backgate electrode of said third MOSFET, and a second main current electrode connected to a gate electrode of said third MOSFET.

21. The CMOS logic circuit as claimed in claim 14, wherein each MOSFET of said CMOS logic circuit is a SOIFET which is formed on a SOI (Semiconductor On Insulator) substrate.

22. The CMOS logic circuit as claimed in claim 21, wherein carrier concentration of a body of each of said low threshold MOSFET is controlled such that said body becomes a fully depleted state.

23. The CMOS logic circuit as claimed in claim 21, wherein carrier concentration of a body of each said low threshold MOSFET is controlled such that said body becomes a partially depleted state.

24. A CMOS logic circuit comprising:
 an internal CMOS logic circuit including a set of M (M is an integer equal to or greater than one) driver transistors and a set of M load transistors, said internal CMOS logic circuit changing its operation mode in response to an external control signal;
 a first MOSFET connected to a first MOSFET circuit constituting one of said set of driver transistors and said set of load transistors, wherein said first MOSFET has a same channel type as said first MOSFET circuit, and comprises a gate electrode and a first main current electrode connected to a backgate electrode of said first MOSFET circuit, and a second main current electrode connected to said external control signal; and
 a second MOSFET connected to a second MOSFET circuit constituting the other of said set of driver transistors and said set of load transistors, wherein said second MOSFET has a same channel type as said second MOSFET circuit, and comprises a gate electrode and a first main current electrode connected to a backgate electrode of said second MOSFET circuit, and a second main current electrode connected to an inverted signal of said external control signal.

25. The CMOS logic circuit as claimed in claim 24, wherein a threshold voltage of each of said first MOSFET and said second MOSFET is lower than a threshold voltage of MOSFETs included in said internal CMOS logic circuit.

26. The CMOS logic circuit as claimed in claim 25, wherein each MOSFET of said CMOS logic circuit is a SOIFET which is formed on a SOI (Semiconductor on Insulator) substrate, and wherein carrier concentration of a body of each of said low threshold MOSFET is controlled such that said body becomes a fully depleted state.

27. The CMOS logic circuit as claimed in claim 25, wherein each MOSFET of said CMOS logic circuit is a SOIFET which is formed on a SOI (Semiconductor on Insulator) substrate, and wherein carrier concentration of a body of each of said low threshold MOSFET is controlled such that said body becomes a partially depleted state.

28. A CMOS logic circuit comprising:
 an internal CMOS logic circuit including a set of M (M is an integer equal to or greater than one) driver transistors and a set of M load transistors, said internal CMOS logic circuit changing its operation mode in response to an external control signal; and
 a first MOSFET connected to a first MOSFET circuit constituting one of said set of driver transistors and said set of load transistors, wherein said first MOSFET has a same channel type as said first MOSFET circuit, and comprises a gate electrode and a first main current electrode connected to a backgate electrode of said first MOSFET circuit, and a second main current electrode connected to said external control signal;
 wherein said internal CMOS logic circuit comprises a memory cell, and said control signal is a word line signal.

* * * * *